US006607094B2

(12) United States Patent
MacDonald

(10) Patent No.: US 6,607,094 B2
(45) Date of Patent: Aug. 19, 2003

(54) APPARATUS AND METHOD FOR DISPENSING MEDICATION

(76) Inventor: Nathan Hollis MacDonald, 35 Oakridge Dr., Marquette, MI (US) 49855

( * ) Notice: Subject to any disclaimer, the term of this patent is extended or adjusted under 35 U.S.C. 154(b) by 0 days.

(21) Appl. No.: 09/853,943

(22) Filed: Aug. 3, 2001

(65) Prior Publication Data
US 2003/0024943 A1 Feb. 6, 2003

(51) Int. Cl.$^7$ .............................................. B65G 59/00
(52) U.S. Cl. ..................... 221/121; 221/119; 221/133; 221/210; 221/211; 294/64.1
(58) Field of Search ................ 294/64.1, 64.3; 221/113, 114, 115, 119, 121, 122, 123, 133, 195, 210, 211, 278

(56) References Cited

U.S. PATENT DOCUMENTS

| 2,094,433 | A | * | 9/1937 | Sharp ......................... 221/210 |
| 3,815,780 | A | | 6/1974 | Bauer .......................... 221/15 |
| 3,820,666 | A | * | 6/1974 | Nye et al. .................... 221/211 |
| 4,223,801 | A | | 9/1980 | Carlson ......................... 221/3 |
| 4,572,403 | A | | 2/1986 | Benaroya ...................... 221/3 |
| 4,573,606 | A | | 3/1986 | Lewis .......................... 221/2 |
| 4,674,651 | A | | 6/1987 | Scidmore ...................... 221/3 |
| 4,725,997 | A | | 2/1988 | Urquhart ...................... 368/10 |
| 4,747,514 | A | | 5/1988 | Stone .......................... 221/4 |
| 4,962,491 | A | | 10/1990 | Schaeffer ..................... 368/21 |
| 5,000,343 | A | * | 3/1991 | Allen ......................... 221/121 |
| 5,047,948 | A | | 9/1991 | Turner ........................ 364/479 |
| 5,090,590 | A | * | 2/1992 | Hoffman ....................... 221/210 |
| 5,240,139 | A | * | 8/1993 | Chirnomas .................... 221/211 |
| 5,246,136 | A | | 9/1993 | Loidl ........................... 221/3 |
| 5,405,048 | A | | 4/1995 | Rogers et al. ................ 221/211 |
| 5,480,062 | A | | 1/1996 | Rogers et al. ................ 221/174 |
| 5,490,610 | A | | 2/1996 | Pearson ......................... 221/2 |
| 5,571,258 | A | | 11/1996 | Pearson ....................... 221/211 |
| 5,657,236 | A | | 8/1997 | Conkright .................. 364/479.14 |
| 5,752,621 | A | | 5/1998 | Passamante ................... 221/13 |
| 5,787,825 | A | * | 8/1998 | Yaji et al. ................... 221/211 |
| 5,826,217 | A | | 10/1998 | Lerner ........................ 702/177 |
| 5,850,344 | A | | 12/1998 | Conkright .................. 364/479.01 |
| 6,224,316 | B1 | * | 5/2001 | Hebrank et al. ............. 294/64.1 |

FOREIGN PATENT DOCUMENTS

FR          966392        * 10/1950 .................. 221/210

* cited by examiner

Primary Examiner—H. Grant Skaggs
(74) Attorney, Agent, or Firm—John J. Swartz

(57) ABSTRACT

Apparatus and method for storing medicaments in bulk and individually dispensing solid medicaments, such as medicine in tablet or pill form, including a rotatable carousel having a plurality of circumferentially spaced-apart upwardly opening storage compartments, each receiving a plurality of identical medicaments in bulk different than the medicaments in each other compartment. Disposed on the carousel between each alternate pair of compartments is a vertical discharge chute which is rotated into alignment with a dispensing station after one of the medicaments is removed from one of the compartments. A vacuum operated probe is pivotally mounted on the frame opposite the dispensing station for swinging movement between a lower position, in which a terminal end of the probe is inside the compartments in engagement with a medicament therein, and a raised position above the carousel, allowing the carousel to rotate to a position in which the adjacent discharge chute is aligned with the terminal probe end. A control system selectively couples a vacuum source to the vacuum operated probe when the probe is in any selected compartment causing the terminal end to sealingly engage in airtight relation to a single medicament whereby the single medicament is carried by the terminal end to a position above the discharge chute where it is released for passage through the discharge chute to an underlying container.

77 Claims, 14 Drawing Sheets

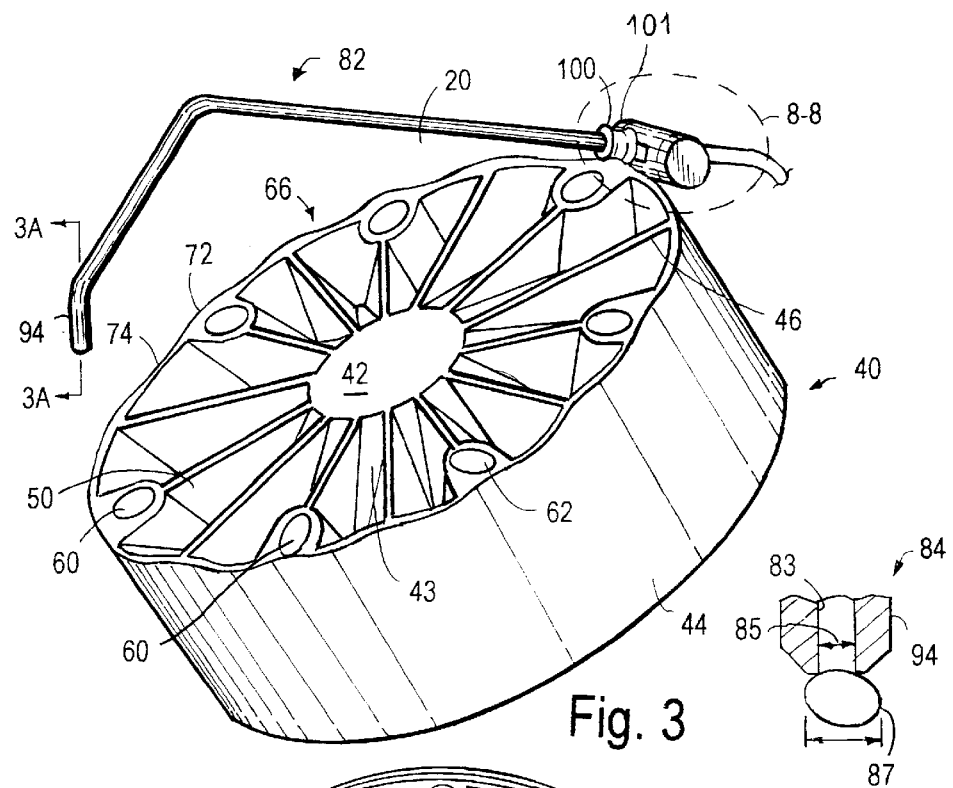
Fig. 3
Fig. 3A
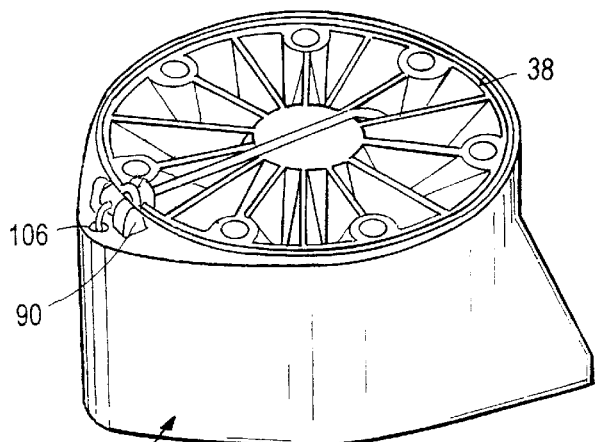
Fig. 4
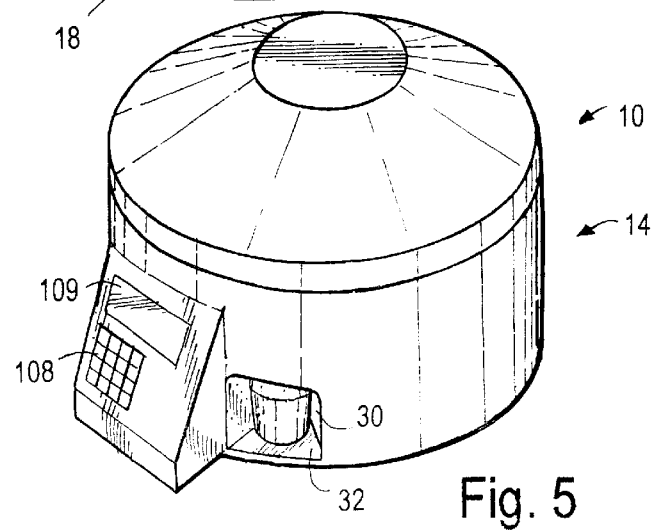
Fig. 5

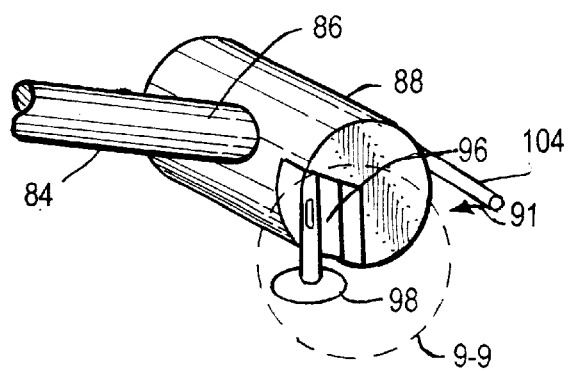
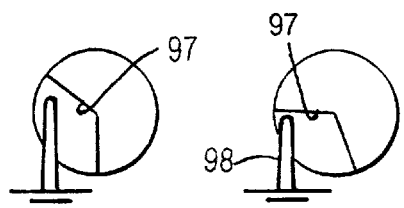
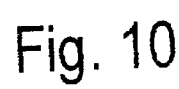
Fig. 8  Fig. 9  Fig. 10
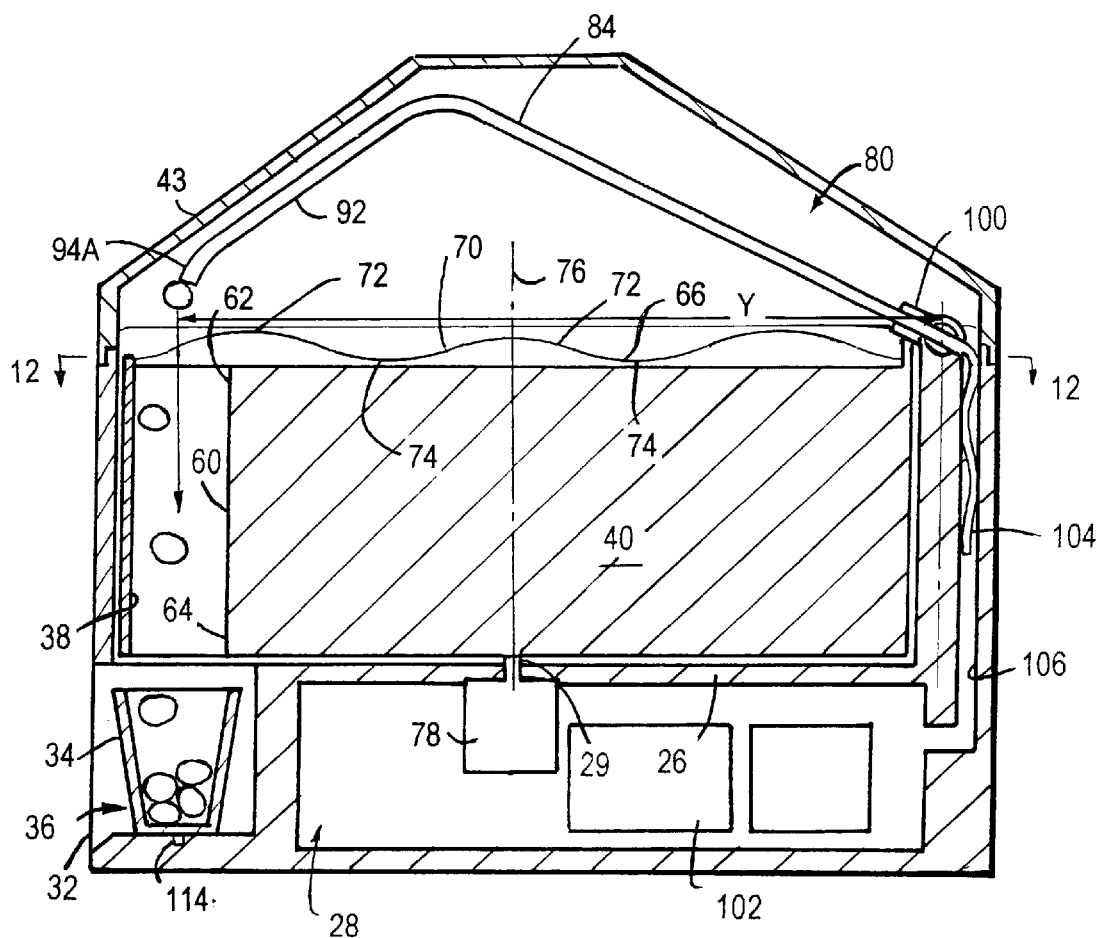
Fig. 11

APPARATUS AND METHOD FOR DISPENSING MEDICATION

BACKGROUND OF THE INVENTION

1. Field of the Invention

This invention relates to apparatus and method for dispensing medication and more particularly to self-dispensing apparatus for storing solid medicaments in bulk and quickly and accurately individually dispensing solid medicaments from the bulk storage while controlling and varying the dosing regimens.

2. Description of Prior Art and Objects

It is common for the elderly to ingest many different pills and tablets of various prescription and non-prescription medicines. It is typical for the medications to be taken in different amounts, on differing days, and at differing times. It is routine for patients to be suffering under the influence of amnesia, either as a result of aged infirmities or amnesia from anesthetic. Geriatric patients lose mental acuity causing many of the lapses resulting in no medication or improper medications by ingesting a double dose. Some people find it necessary to keep a written memorandum as a reminder of when and how many pills they are to take. Some carry a check list, however, they sometimes forget to check off the check list and, thus, they either suffer from taking a double dose of medication and/or from not taking enough medication.

Moreover, geriatric patients frequently lose visual acuity resulting in the inability to properly read labels on the pill containers. If a nurse is helping the individual, the nurse regularly has many patients and may visit other than at the prescribed times for taking the medications. Typically, geriatric patients suffer from being under medicated or over medicated. Inaccurate historical reporting also interferes with a prescribing physician's treatment. Accordingly, it is an object of the present invention to provide new and novel method and apparatus for accurately dispensing varying doses of medications at varying prescribed times.

It has been found advantageous to store a variety of medications in bulk in a plurality of compartments provided in a rotary carousel. Carousels have been provided heretofore in pill dispensing devices such as that illustrated in U.S. Pat. No. 4,725,997 issued to John Urquhart on Feb. 16, 1988. The Urquhart patented device stores medication in a series of circumferentially spaced-apart pockets provided in a carousel; however, a high degree of dexterity is required to remove the pills from the pockets and thus has serious limitations, particularly involving the elderly.

U.S. Pat. No. 5,657,236 issued to Gary W. Conkright on Aug. 12, 1997, discloses a medication dispensing and timing system which performs several functions but which does not in fact dispense the medications.

U.S. Pat. No. 5,047,948 issued to Joseph D. Turner on Sep. 10, 1991, discloses a medication dispensing system in which the medication is prepackaged. Accordingly, it is an object of the present invention to provide medication dispensing apparatus which will allow the medication to be stored in bulk form prior to being dispensed.

It is another object of the present invention to provide new and novel medication dispensing apparatus for aiding patients who must ingest various medications in various amounts, several times a day for an extended period.

It is yet another object of the present invention to provide new and improved apparatus for storing various medications in bulk form and a capacity to select and dispense any selected number of each medication in a single dose.

Most medication, whether sold in pill or tablet form, is quite small in size and many geriatric patients do not have the dexterity to individually grip the pills or tablets. It has been found advantageous to utilize a vacuum operated probe or finger which seals in airtight relation to a single solid medicament and then lifted or moved. One such prior art device is illustrated in U.S. Pat. No. 5,490,610 issued to Walter G. Pearson on Feb. 13, 1996. Such a device, however, requires the patient to remember the time and date when pills are to be taken and further requires that the patient have considerable dexterity to periodically manually install a vacuum tube through a small tunnel in a sidewall where pills are kept in bulk. Accordingly, another object of the present invention is to provide an easily operated vacuum operated system for automatically, accurately retrieving and dispensing pills or tablets from a plurality of bulk storage bins with challenged manual dexterity and coordination.

It is yet another object of the present invention is to provide a vacuum operated system for accurately retrieving any desired number of pills from any of a plurality of storage bins in bulk form and depositing them into a single container to be ingested by the user at any one of a plurality of selected times and on any one of a number of a plurality of selected days.

Still another object of the present invention is to provide medicament dispensing apparatus of the type described including a new and novel vacuum operated probe or finger for retrieving an oral solid medication or other pharmaceutical from a bulk supply.

It is a further object of the present invention is to provide new and improved medicament dispensing apparatus of the type described that will store and dispense various medications in the proper chronological order, daily intervals, and for an extended period of time.

It is a still further object of the present invention to provide new and novel apparatus for accurately dispensing individual solid medicaments such as pills or tablets from a plurality of bulk storage bins.

Other vacuum operated medicine dispensers are illustrated in U.S. Pat. Nos. 5,405,048 and 5,480,062 issued to Lisa M. Rogers, et al on Apr. 11, 1995, and Jan. 2, 1996, respectively. In this construction, a probe is associated with each and every bin and does not include a single pivotal vacuum operated probe which can be disposed in any selected one of the containers to pick up a pill therein and dispense it at a dispensing station. Accordingly, it is an object of the present invention to provide new and novel pill dispensing apparatus of the type described which includes a single vacuum finger that is pivotally mounted on a frame for movement in a vertical swinging path of travel between a lowered position in any selected one of the bins and a raised position above the carousel allowing the carousel to be rotated.

It is another object of the present invention to provide new and novel medicament dispensing apparatus of the type described wherein a single vacuum operated finger successively enters each bulk storage bin and a control system that applies vacuum to the finger in any selected bin to detachably hold one random pill therein.

Yet another object of the present invention is to provide a pill dispensing apparatus and method of the type described including a carousel provided with a plurality of pill storing bins and a plurality of vertical discharge openings therethrough adjacent the bins and a vacuum operated probe which can swing downwardly into any selected bin to pick up and remove a random pill and hold it until a vertical discharge passage is thereunder and then releasing the pill for discharge through one of the discharge openings.

It is another object of the present invention to provide a method of discharging medications including the steps of retrieving a pill from one of the bins and moving it to an elevated position above the bins, holding the pill in an elevated position and then moving a discharge chute into alignment therewith.

It is still another object of the present invention to provide a method of discharging solid medicaments by elevating an individual medicament from a bulk storage carousel bin to an elevated position above the carousel and then rotating a carousel to dispose a vertical discharge chute provided in the carousel into vertical alignment with the elevated pill and then releasing the vacuum and discharging the pill to the chute.

The construction illustrated in U.S. Pat. No. 5,480,062 includes a vacuum operated medicine dispenser which includes a vacuum probe associated with each and every storage bin, which is a relatively expensive construction. Accordingly, it is another object of the present invention to provide a new and novel apparatus of the type described which utilizes a single vacuum finger that is selectively moveable in to and out of all of a plurality of bulk storage bins carrying a plurality of different medicaments.

The aforesaid U.S. Pat. No. 5,480,062 also includes a complicated system for moving the withdrawn pills to a position radially outwardly of the carousel in which the pills are stored. Accordingly, it is another object of the present invention to provide apparatus of the type described including a new and novel apparatus overlying the carousel for dispensing solid medicaments following their removal from a bulk storage bin.

It is yet another object of the present invention to provide new and novel method and apparatus of the type described which includes dispensing passages disposed in the carousel for receiving and passing solid medicaments removed from the bulk storage bins to a single container disposed below the carousel.

It is another object of the present invention to provide pill storage and dispensing apparatus of the type described which includes at least one dispensing passage disposed adjacent each pill storage bin.

Yet another object of the present invention is to provide pill storing and dispensing apparatus of the type described including a pill dispensing chute there-through between each successive pairs of bulk storage compartments.

Still yet another object of the present invention is to provide pill storage and dispensing mechanism of the apparatus of the type described including pill dispensing chutes which are radially aligned with the tip end of a vacuum probe that lifts a pill to a raised position above a storage bin and holds it until a dispensing chute is disposed thereunder.

It is a further object of the present invention to provide new and novel cam and cam follower mechanism for vertically swinging a single vacuum probe in a to-and-fro swinging path of travel to move a vacuum probe tip end into and out of the bulk storage bins as the carousel rotates.

Another object of the present invention is to provide a rotary bulk storage carousel of the type described having a hub and an annular sidewall spanned by a plurality of circumferentially spaced vanes defining upwardly opening compartments for storing pluralities of different medicaments and a discharge chute in the carousel aligned with the radially outer ends of the vanes separating each successive pair of storage bins.

These and other objects of the present invention will become more readily apparent as the descriptions hereof proceeds:

SUMMARY OF THE INVENTION

Apparatus for storing and dispensing solid medicaments comprising: a frame having a retrieving and dispensing station thereon; a carousel mounted on the frame for rotation about a vertical axis and including a plurality of circumferentially spaced-apart, upwardly opening compartments for storing the medicaments in bulk; mechanism for rotating the carousel about the vertical axis to dispose any selected one of the compartments at the retrieving and dispensing station; and medicament retrieving mechanism swingably mounted on the frame between a lowered pill retrieving position in which a terminal end of the retrieving mechanism adheres to a solid medicament in the selected compartment and an elevated position above the selected compartment for lifting a solid medicament from the selected compartment to a raised position above the carousel.

DESCRIPTION OF THE DRAWINGS

The invention may be more readily understood by referring to the accompanying drawings, in which:

FIG. 3 is a perspective view of the carousel and a pivotal vacuum probe only illustrated in a raised position removed from the bulk storage compartments;

FIG. 3A is an enlarged sectional side view of the terminal end of the vacuum probe sealed to a pill for transport;

FIG. 4 is a slightly reduced, rear perspective view of the base and carousel illustrated in FIG. 2 to better illustrate the carousel with the pill lifting vacuum probe being illustrated in a lowered position received by one of the upwardly opening compartments or pill storage bins;

FIG. 5 is a reduced front perspective view, of the storing and dispensing apparatus illustrated in FIG. 1, more particularly illustrating a pill receiving container for receiving the pills dispensed by the carousel in a single dosing regimen;

FIG. 8 is a greatly enlarged perspective view of a portion of the hinge mechanism and limit switch associated therewith, illustrated in the chain line circle 8—8 of FIG. 3 for signaling the level of pills stored in each bin visited by the swinging movement of the vacuum probe;

Figure 1:
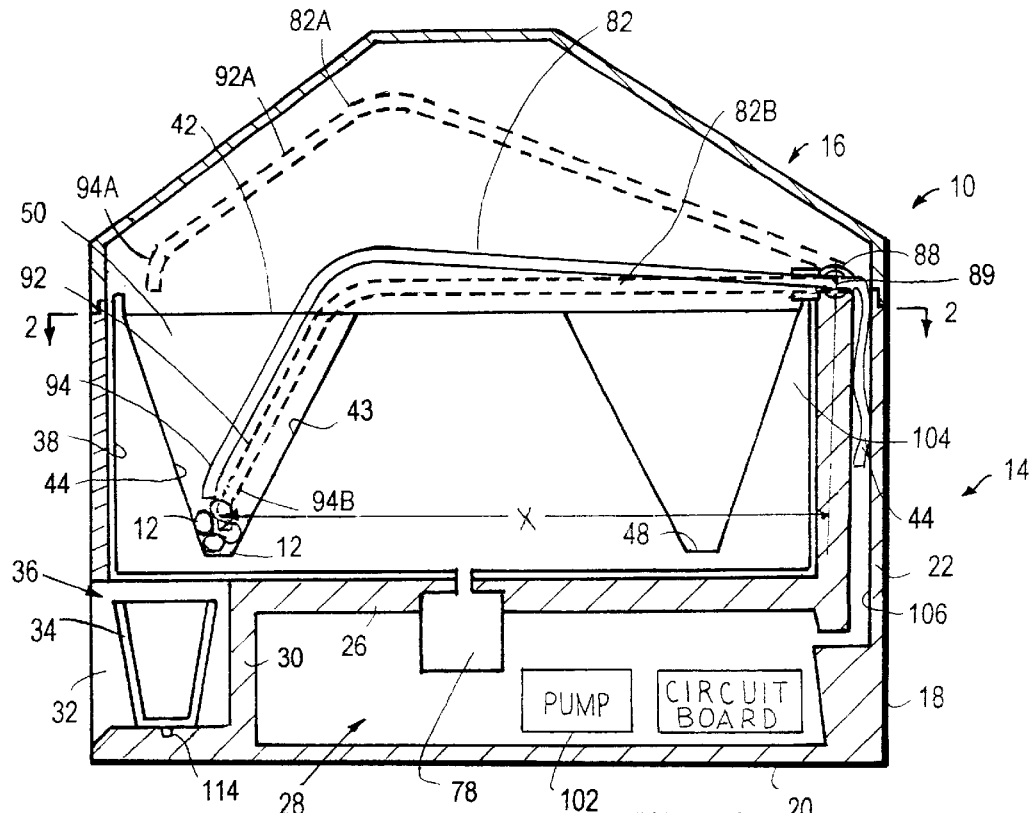
FIG. 1 is a sectional side view of storing and dispensing apparatus constructed according to the present invention, taken along the section line 1—1 of FIG. 2 with the vacuum finger illustrated in an intermediate position, disposed in one of the bins or compartments, and in chain lines in raised and lowered positions.
Figure 2:
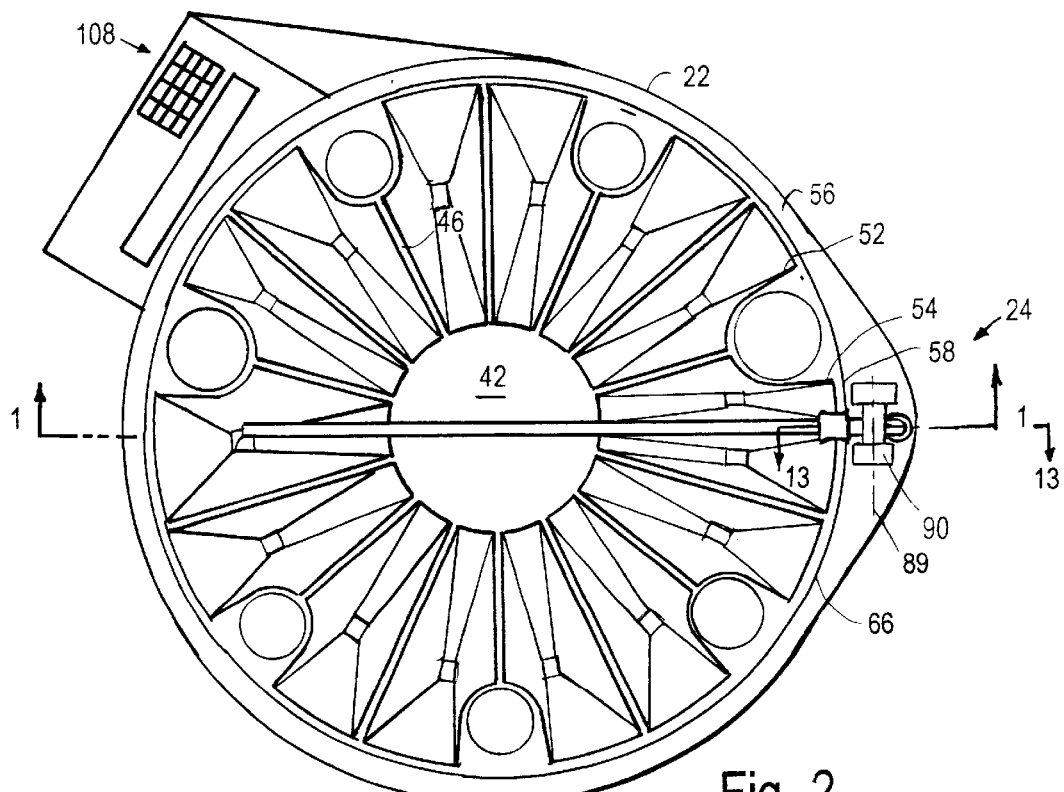
FIG. 2 is a top plan view of the base and carousel of the storing and dispensing apparatus, taken along the line 2—2 of FIG. 1, more particularly illustrating a rotary, bulk storage carousel and the hinge end of the vacuum probe positioned in a cam valley.
Figure 6:
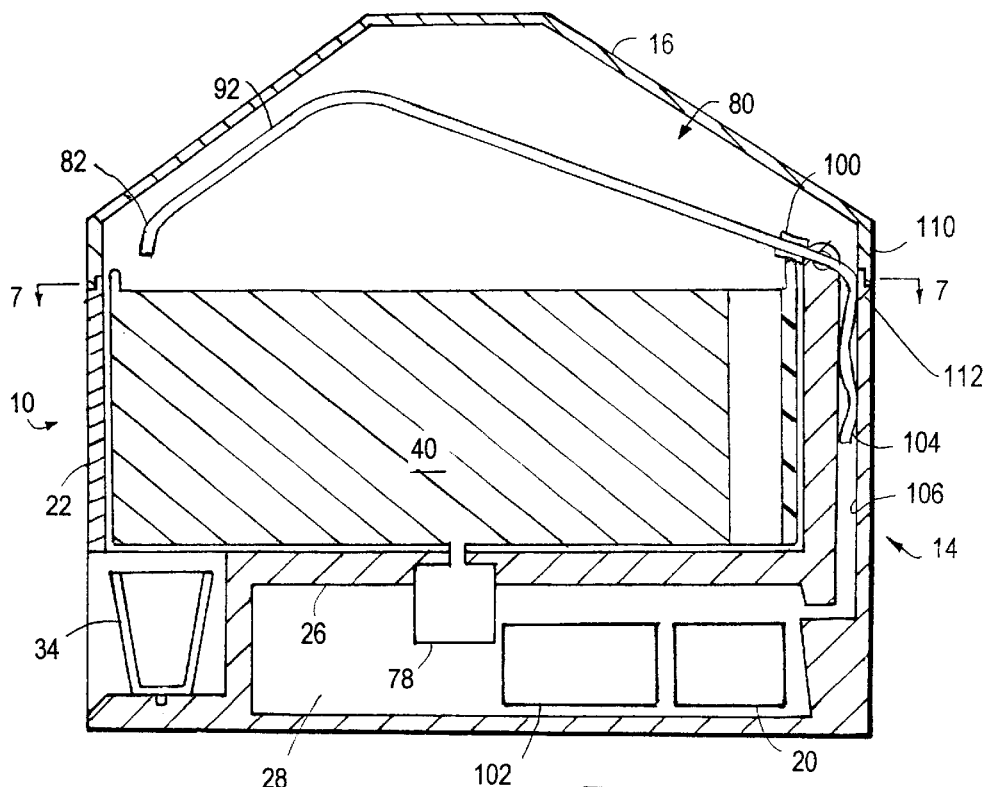
FIG. 6 is a sectional side view similar to FIG. 1, taken along the section line 6—6 of FIG. 7, but illustrating the carousel in a slightly rotated position and the vacuum probe in an elevated position above the carousel.
Figure 13:
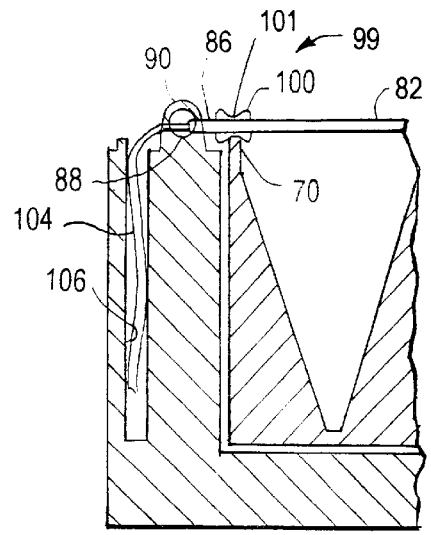
Figure 12:
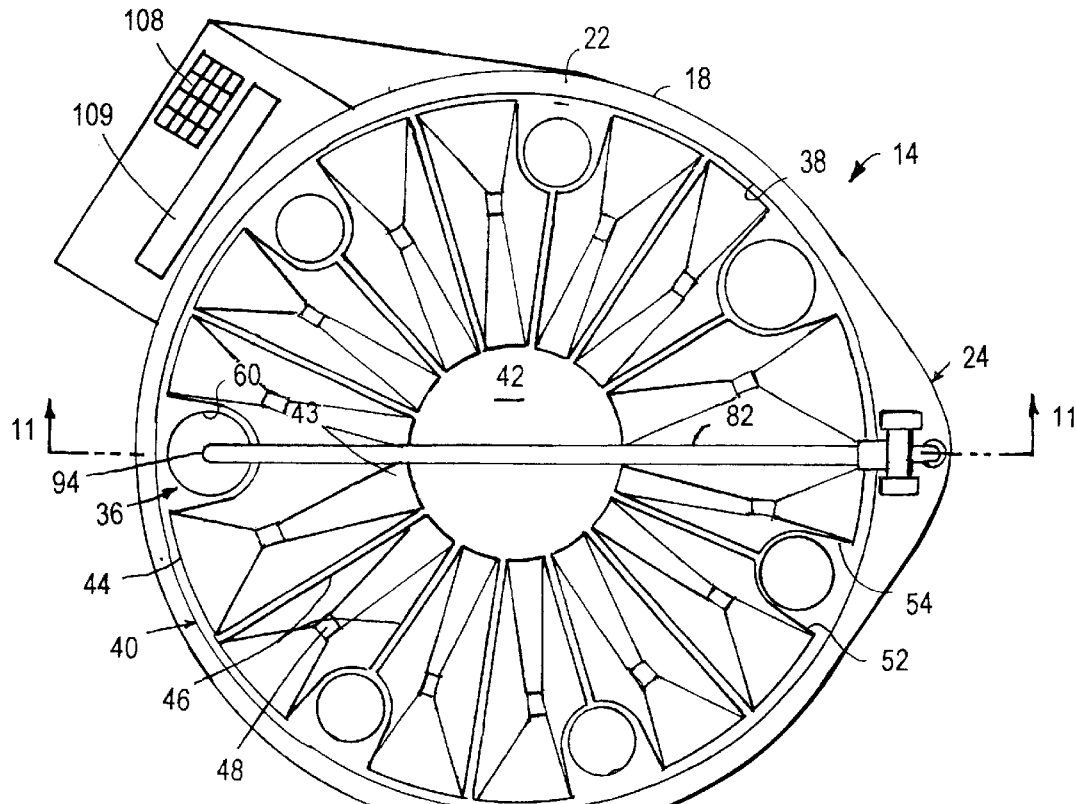
Figure 14:
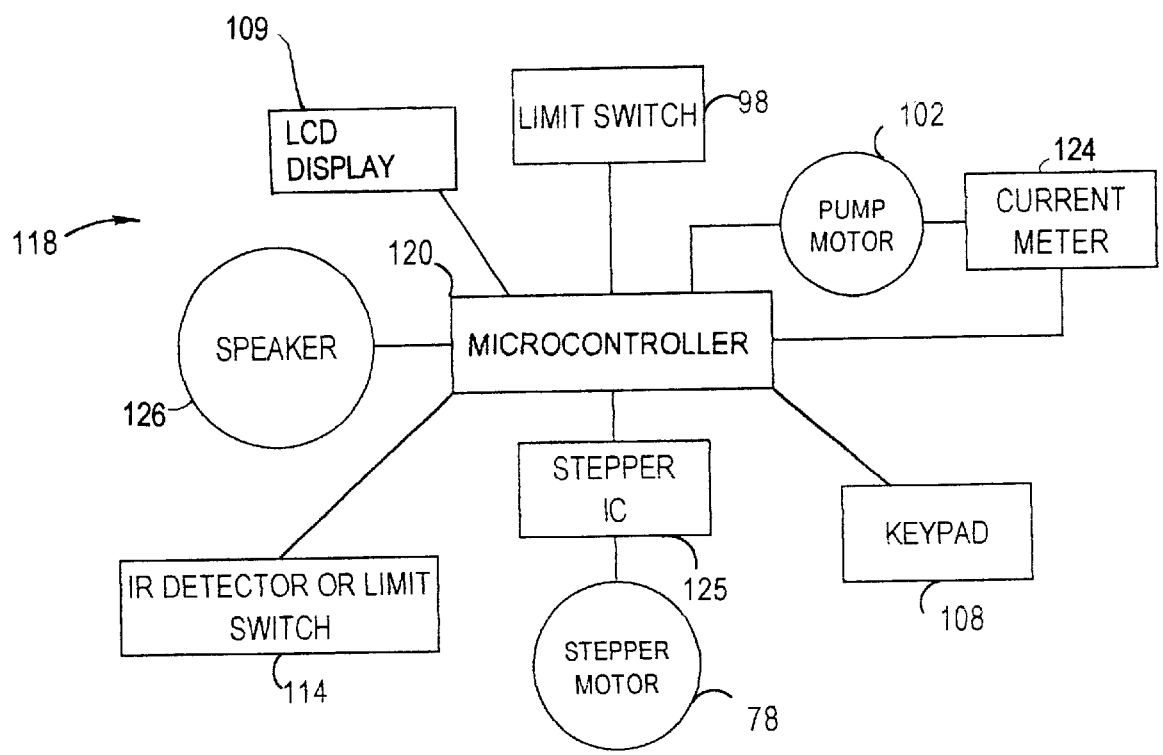

FIG. 9 is a greatly enlarged end elevational view of the portion encircled in the chain line 9—9 of FIG. 8;

FIG. 10 is a view similar to FIG. 9 illustrating the hinge parts of FIG. 8 in adjusted positions after the vacuum probe has been lowered beyond the threshold level of pills stored in a bin;

FIG. 11 is a sectional side view, taken along the section line 11—11 of FIG. 12, similar to FIGS. 1 and 6, but illustrating the carousel in another slightly adjusted rotary position with the terminal end of the vacuum finger disposed above one of the discharge chutes;

FIG. 12 is a top plan view, taken along the line 12—12 of FIG. 11, more particularly illustrating the carousel with the hinge end of the vacuum probe aligned with one of the cam peaks on the carousel side wall and the probe tip end disposed in vertical alignment with a discharge chute provided between a pair of bins in the carousel;

FIG. 13 is a greatly reduced fragmentary sectional side view, taken along the section line 13—13 of FIG. 2, more particularly illustrating the hinge and cam mechanism;

FIG. 14 is a functional block diagram of the circuitry included in the storage and dispensing apparatus constructed according to the present invention; and FIGS. 15A, 15B, 16A, 16B, 17A, 17B, 18A, 18B and 19, collectively, are a schematic of a computer programming flow chart of apparatus constructed according to the present invention.

DESCRIPTION OF PREFERRED EMBODIMENT

Pill storing and dispensing apparatus, generally designated 10, is particularly adapted for storing solid medicine or medicaments 12, commonly found in pill or capsule form. The apparatus 10 includes a hollow base or frame, generally designated 14, detachably closed by a cover 16. The base or frame 14 includes a hollow upwardly opening cylindrical housing, generally designated 18, having a bottom wall 20, an upstanding annular side wall 22 having an enlarged thickness, probe mounting sidewall portion, generally designated 24.

The base 14 includes a false floor 26 spaced above the bottom wall 20 to provide a component storage cavity 28 there-between. The side wall 18 is radially inwardly recessed at 30 to define a radially outwardly opening container cavity 32 for externally receiving a medicament receiving container 34 at a medicament retrieving and dispensing station, generally designated 36. The annular side wall 22 and the false bottom floor 26 define an upwardly opening cavity, generally designated 38, which rotatably receives a medicament storage carousel or rotor, generally designated 40.

The carousel 40 may suitably comprise a one piece molded plastic cylindrical block having a solid inner plastic hub 42, having a radially outwardly downwardly diverging sidewall 43, and an annular radially outer, radially inwardly downwardly inclined side wall 44 spanned by a plurality of circumferentially spaced-apart radially extending downwardly converging vanes or sidewalls 46 which downwardly converge to a floor 48 and collectively define a plurality of circumferentially spaced-apart, upwardly opening medicament or pill receiving cavities, bins or compartments 50. A plurality of different medicaments 12 are stored in bulk in each cavity 50 different than the plurality of medicaments in each other compartment 50. It should be understood that the number of storage compartments may vary from that illustrated.

Disposed between the radially outer portions 52 and 54 of every second pair of cavities 50, and in radial alignment with the radially outer ends of alternate radial vanes 46 and located at the junction of the annular side wall 44 the radially outer end of vanes 46, is a vertical pill dispensing chute or aperture 60 which passes completely through the carousel or rotor 40 and is open-ended at its top 62 and includes a bottom opening 64 in the false floor 26 above the cavity 32 for passing a pill to the container 34 at the dispensing station 36 as will be described more particularly hereinafter. The open bottom end 64 is provided in the false floor 26 radially outwardly of the recessed wall 30. The pill dispensing chutes 60 are radially disposed so as to be in vertical alignment with a container 34 at the dispensing station 36 and between every-other successive pair of pill compartments 50.

The annular outer sidewall 44 includes an undulating upper edge, generally designated 66, which defines a cam 70 having circumferentially alternate raised peaks 72 and lowered valleys 74. The peaks 72 are radially aligned with the vanes or spokes 46 and the valleys are radially aligned with the bins or compartments 50. The carousel 40 is rotatably driven about a vertical axis 76 via a step motor 78 disposed in the storage cavity 28 and coupled thereto via a shaft 29.

Dispensing apparatus, generally designated 80, is provided for randomly lifting or picking up a single medicament 12 in any selected one of the compartments 50 and depositing it into the container 34 at the dispensing station 36. The dispensing apparatus 80 includes a vacuum finger or probe 82 including an elongate one-piece hollow vacuum communicating tube 84 having a mounting end 86 coupled to a hinge pin 88 which is journaled for rotation about a horizontal axis 89 via bearings 90 provided on the enlarged thickness portion 24 of the sidewall 22. It should also be noted that the probe 82 is moved downwardly under its own weight and the force of gravity and thus less power is consumed in order to make the device function. In fact, no additional lifting mechanism is required to raise the probe other than rotation of the carousel which causes a direct mechanical link without any other intervening moving or lifting mechanisms. The carousel 40 moves in a horizontal path of travel and the probe 82 swings in a vertical path of travel into and out of each successive compartment 50 disposed at the retrieving and dispensing station 36.

A mid-portion 92 of the hollow tube 84 is bent downwardly at an angle to generally match the downward slope of the radially inner compartment defining walls 43 when disposed in the cavity or compartments 50 in the position illustrated at 82A in FIG. 1. The terminal tube end portion 94 is further angularly offset or bent downwardly relative to the partially bent mid-portion 92 so as to be generally vertical when the tube 84 is in its lower-most position illustrated at 82B in FIG. 1. It should be noticed that, when probe 82 is positioned as illustrated in FIG. 1, the horizontal distance X between the terminal tip end 94B and the rotational axis 89 is less than the distance Y (FIG. 11) between the terminal tip end 94A and the axis 89 when the probe is positioned at 82A as illustrated at 94A in FIG. 1 and as illustrated in FIG. 11. Similarly, the horizontal distances between the tip end 94 and the rotational axis 76 in the lower-most position illustrated in FIG. 1 is less than the horizontal distance between the tip end 94A and the vertical axis 76 in the position illustrated in FIG. 11. Because of this bent configuration, the medicament lifting tip 94 will swing radially outwardly in an arcuate path from the lowered position illustrated at 94 in FIG. 1 to the raised position illustrated at 94A in FIG. 11 in vertical alignment with the discharge chute 60. The tube 82 has an elongate passage 83 therein and is of such diameter 85 as to be less than the minimum breadth 87 of a pill 12 to be removed.

Pill level sensing apparatus, generally designated 91, is provided for sensing the level of the medicaments 12 dropping below a predetermined level (i.e., ⅔ empty) in each of the bins or compartments 50. The pill level sensing apparatus 91 includes a cut out or notch 96 on the hinge 88 having a cam surface 97 which will engage a limit switch, generally designated 98, when the terminal probe end 94 of the probe 84 is below the predetermined level.

Apparatus, generally designated 99 is provided for vertically swinging the probe 82 and includes a cam follower roller, generally designated 100, rotatably mounted on the inner end 86 of the vacuum finger 82 and including a groove 101 which rides on the cam 70 to force the vacuum finger 82 to vertically move between a lowered picking position, illustrated in FIG. 1 and a raised position, illustrated in FIGS. 6 and 11, as the roller 100 moves from one of the valleys 94 to the adjacent peak 72.

As the vacuum finger 82 moves into the compartments 50 downwardly below a predetermined level, the cam surface 97 will engage the limit switch 98, as illustrated in FIG. 10 and a signal will be provided to the operator to replenish the medication in the bins which have an inadequate supply of medicaments.

The vacuum finger 82 is coupled to a vacuum pump 102, disposed in chamber 26, via a suitable vacuum line 104 which is received in a vertical passage 106 provided in the enlarged probe mounting housing portion 24 adjacent the hinge pin 86. The base 14 also externally mounts a keypad, generally designated 108, which is provided for entering data to an operating system 118 (FIG. 14) as to which cavities or bins 50 will have medicaments 12 extracted therefrom by the probe 82 and in which quantity, what time and on what days.

The lower peripheral edge 110 of the cover 16 and upper peripheral edge 112 (FIG. 6) of the base sidewall 22 includes cooperating notched portions which frictionally engage to detachably hold the cover 16 onto the base 14. The access cover 16 is removable to allow the user to pour whatever medicament 12 is desired in each of the compartments 50.

Apparatus is provided for sensing whether or not medicaments 12 dispensed through the chutes 60 to the container 34 have been removed for consumption and includes a limit switch 114 underlying the container 34 at the retrieving and dispensing station 36. If the medications have not been removed from the station 36, medications obviously they have not been consumed, and the entire dispensing operation will cease until such time as the container having medications previously deposited therein is removed from the limit switch 114. The base 14 also includes an external LCD display 109 for displaying printed data and messages for the operation.

The Control Circuit Operation and Method

A computer operating system, generally designated 118, for operating the apparatus illustrated in FIGS. 1–13 is schematically illustrated in the functional block diagram of in FIG. 14. It will be assumed that the parts are initially in the positions illustrated in FIGS. 6 and 7 with the cam follower roller 100 radially aligned with one of the radial vanes 46 and riding on one of the cam peaks 72 and the vacuum probe 82 being disposed in the position illustrated above the carousel without any medicament 12 being held thereby.

The operating system 118, which is suitably coupled to a source of electrical power, includes a microcontroller or microprocessor 120. The user, via the keypad 108, will feed to microcontroller 120 certain data, such as what bins or compartments 50 are being supplied with pills 12, how many days medications are to be taken, and how many medications are to be dispensed at what times, intervals, days of the week. The entry of this data will program the microcontroller 120.

The microcontroller 120 includes a clock which counts to the time when a pill 12 is to be dispensed. When that time is reached, the microcontroller 120 will automatically direct the step motor 78, via integrated circuitry 125, to receive power to drive motor 78 and index the carousel 40, in the direction of the arrow 123, from the position illustrated in FIGS. 6 and 7 to the position illustrated in FIGS. 1 and 2. As the carousel 40 rotates to a position in which the selected bin 50 is disposed at the retrieval and dispensing station 36, the vacuum finger 82 is concurrently moved downwardly to the position illustrated in FIG. 1 into the trough of the selected bin or compartment 50. As the carousel 40 rotates and the follower roller 100 rides down the cam peak 72 passes into the adjoining cam valley 74, the vacuum probe or finger 82 will fall by gravity into the adjacent compartment 50. The finger terminal end 94 enters the bin downwardly by gravity until such time as the terminal probe end 94 engages the pills on the top of the pile of pills 12.

Suction is not applied by the pump motor 102 until the system senses that the vacuum finger 82 is disposed in the proper selected compartment or bin 50. The carousel will continue to rotate until the probe 82 reaches the proper bin, at which time the pump motor 102 will be energized by the micro-controller 120.

When the correct bin 50 is disposed at the station 36, the microprocessor 120 will activate power to vacuum pump motor 102 causing a vacuum or suction forces to be created in the vacuum probe 82 and terminal probe end 94. The pump motor is coupled in circuit with a current meter 124 which senses the current supplied to pump motor 102. The current to the motor 102 will decrease when the terminal tube end 94 seals in airtight engagement to a pill 12 because the power forces required to maintain the vacuum in tube 94 will decrease and thus the current to the motor will decrease. The microcontroller will sense this current change and thus will instantly know when a pill 12 is sealed to the probe end 94.

When the microcontroller 120 senses that a random medicament 12 in the selected compartment 50 has been sealed to the probe end 94, the microcontroller 120 will cause power to be delivered to the step motor 78 forcing the motor 78 to continue to rotate in the direction of the arrow 123. When the carousel 40 rotates, the cam follower roller 100 will travel along the next following cam peak 72 forcing the vacuum finger 82 to swing upwardly out of the compartment 50 and into alignment with the adjacent pill dispensing passage 60 as illustrated in FIGS. 11 and 12. The terminal tip end 94 and the pill 12 supported thereon will be vertically aligned with the passage or discharge chute 60 and the underlying container 34. When a medicament is deposited into the container 34 at station 36, the limit switch 114 will close. When the dispensing cycle has been totally completed, the cycle will not restart until such time as the container 34 has been removed from the switch 114.

When the carousel is disposed in the position illustrated in FIG. 11, the vacuum pump motor 102 is rendered inoperative so that the vacuum is released and the pill 12, which is vacuum supported thereon falls by gravity through the chute 60 into the underlying container 34. The microcontroller 120 controls the voltage to the pump 102 causing it to start and stop.

Figure 7:
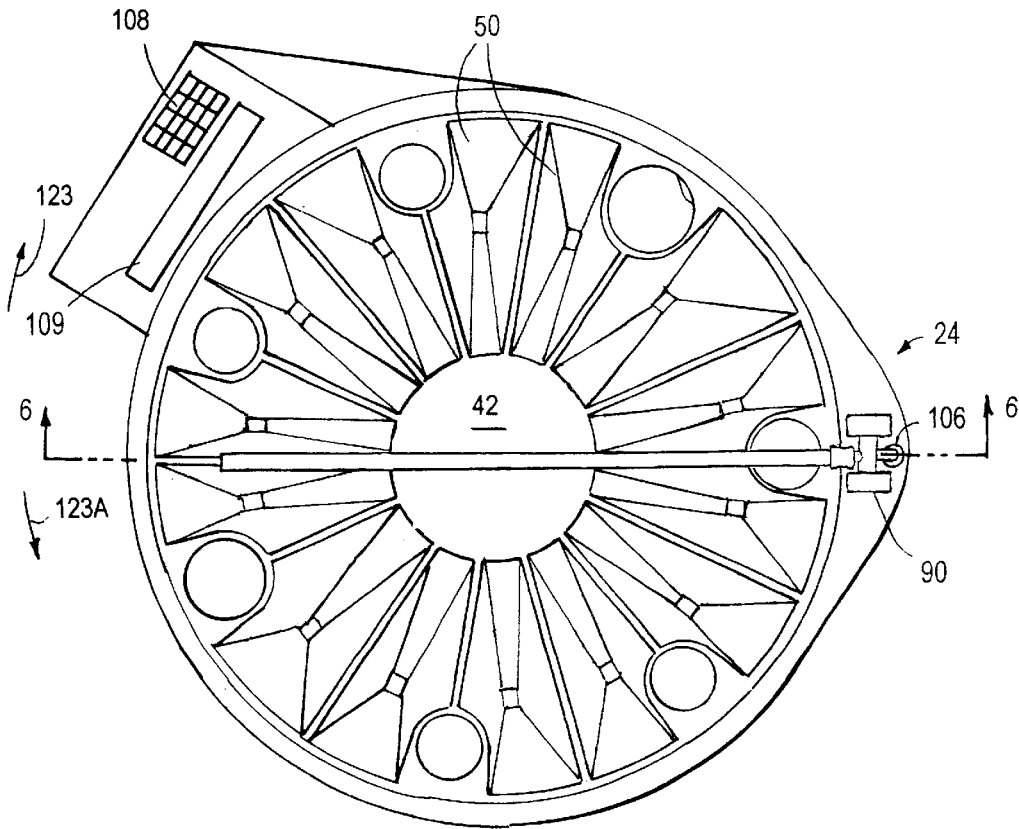
FIG. 7 is a sectional plan view, taken along the line 7—7 of FIG. 6, more particularly illustrating the pivotal vacuum probe disposed in radial alignment with one of the radial carousel vanes and riding on one of the cam peaks.

If there is another pill of the same medication that comes out of the same bin 50, the microprocessor will cause the step motor 78 to reverse direction and rotate the carousel 40 in the opposite direction 123A until the same bin 50 is at the station 36 and the probe 82 is permitted to freefall by gravity to the position illustrated in FIGS. 6 and 7.

The stepper motor 122 can drive the carousel 50 in either direction 123 or 123A and can be directed to return to the identical bin that it just picked a pill from to repeatedly pick up pills from the same bin as many times as is necessary and reach and deposit them into the discharge chute 16.

The operation continues and pills 12 are selected as necessary from the appropriate bins and deposited into the chutes 16 adjacent the bins 50 from which the pills 12 are retrieved. The device continues to operate to move to the selected bin, that's been programmed into the memory, and repeats for each pill at the selected time. When all of the pills 12 from the various selected bins 50 have been deposited into the container 34 for the dose, the microcontroller 120 signals a speaker 126 to alert the user that the operation is completed so that a patient who has limited eyesight will know the container is full. Also, the LCD display 109 will print out the message that the filling cycle has been completed for that particular time so that one who is unable to hear can likewisely be signaled that the operation for this dose was completed. There is an audible alert as well as a text message on the liquid crystal display 109 that tells the patient that the medication is ready to be taken.

If the patient doesn't remove the medication container 34 from the station 36 and the next dosing period comes along, the microcontroller will sense that the cup 34 has not been removed and any doses for the following times be skipped until the container 34 is removed.

When the container 34 is removed, the micro-controller 120 will assume that the person has taken the medication or somehow skipped these doses.

The system can be programmed to skip doses if desired. The system can also be programmed to "pre-dose" which allows the user, if going on a trip, to fill a number of cups to be taken with the user and the system can be programmed to drop the medications earlier than otherwise would be required.

The system can be programmed to pre-dose or drop the medication early and the user can go back to it after the completion of the vacation and the micro-controller will pick up with the next scheduled dose and can be continued to be operated.

For example, once the user pre-doses for two days, the microprocessor won't start dosing again until the third day. The controller has a memory that keeps track of that information.

Referring now more particularly to FIGS. 15A–19, the software flow diagram is illustrated to better assist in understanding the operation of the system illustrated in FIGS. 1–14.

In each of these Figures, the parenthesis symbols, i.e., ( ), indicate which component is performing the function and the quote symbol, i.e., " " indicates something that is being displayed to the user.

Figure 15A:
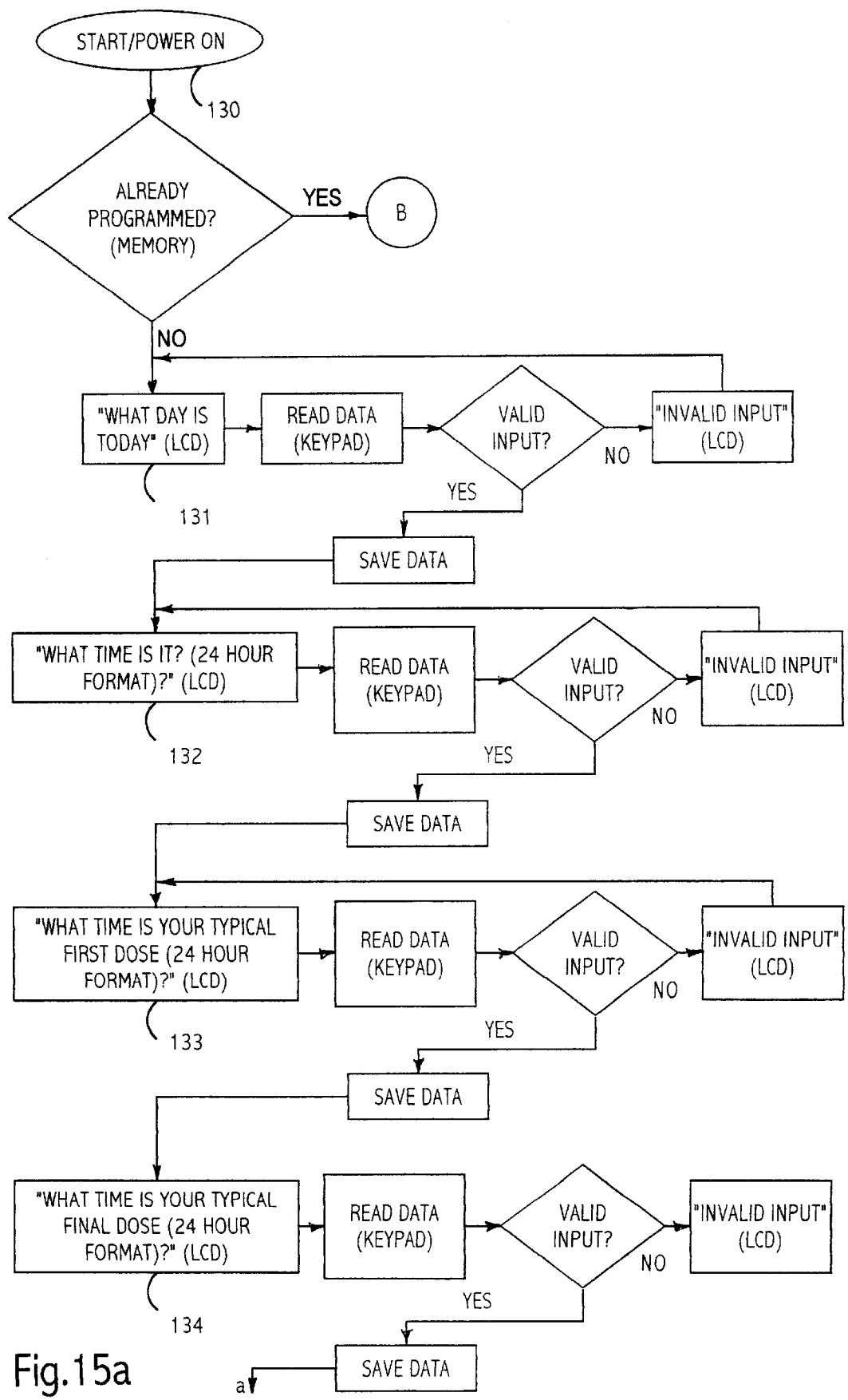
Figure 15B:
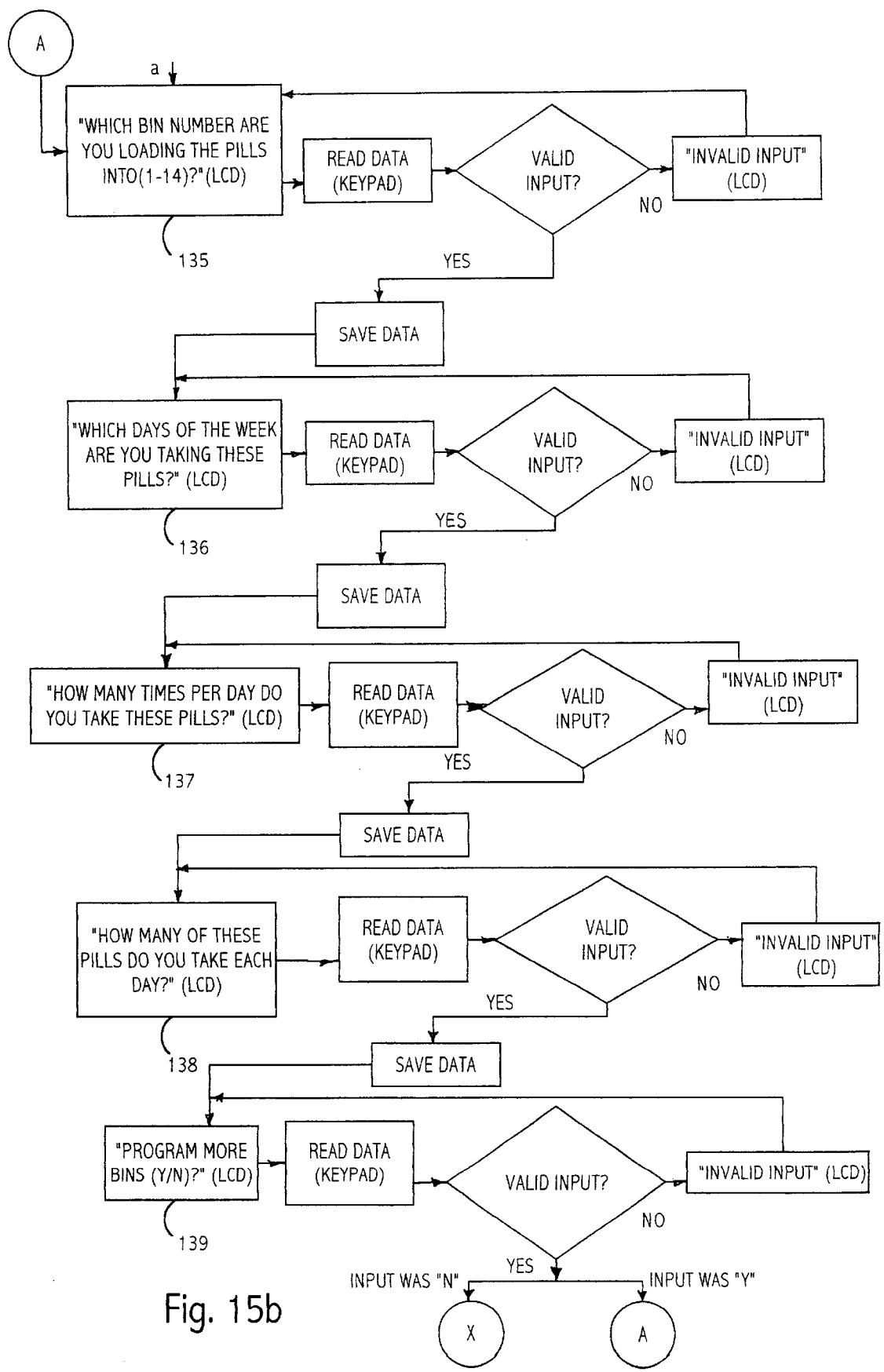

FIGS. 15A and 15B is the flow diagram of the user input program which starts out by the user turning on the power at 130 and then inserting a series of inputs at 131, 132,133 and 134 with regard to what day it is, what time it is, a typical first dose and a typical final dose. Assuming all of that information is accurately placed into the LCD 109 and the microcontroller 120, the next entry to be programmed is which bin 50 is to be loaded. This is done by merely typing the selected bin number on the keypad 108 and then the user inputs the other information with regard to the days of the week, times, etc., as indicated at 136, 137 and 138.

After the first selected bin 50 is programmed into the operating system, the user will then be questioned at 139 as to whether or not more bins are to be programmed and the user again will appropriately type in the next bin to be programmed so that the input at "A" is recycled and the operation is repeated for however many bins 50 are to have medicaments 12 dispensed therefrom.

Figure 16A:
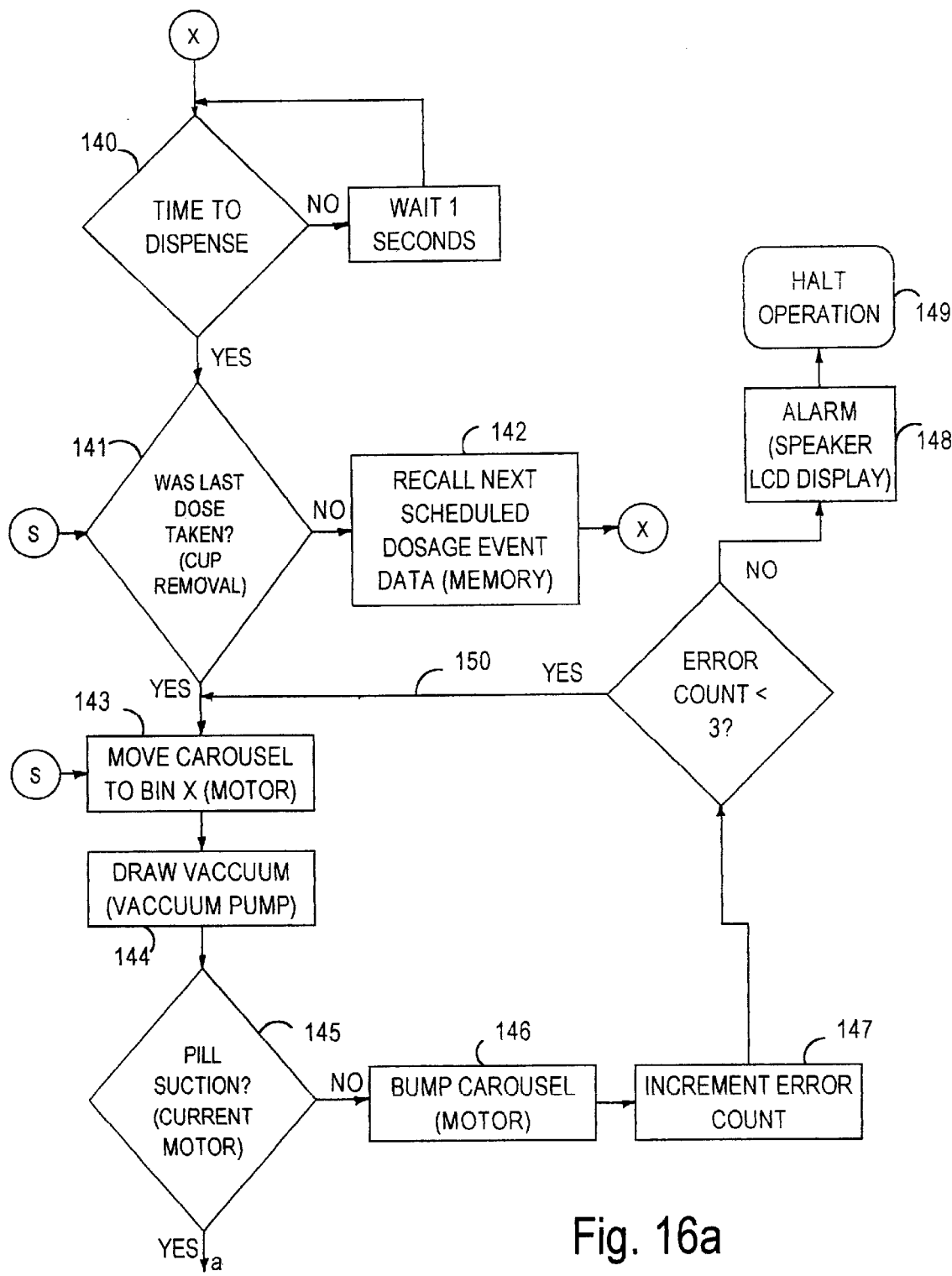
Figure 16B:
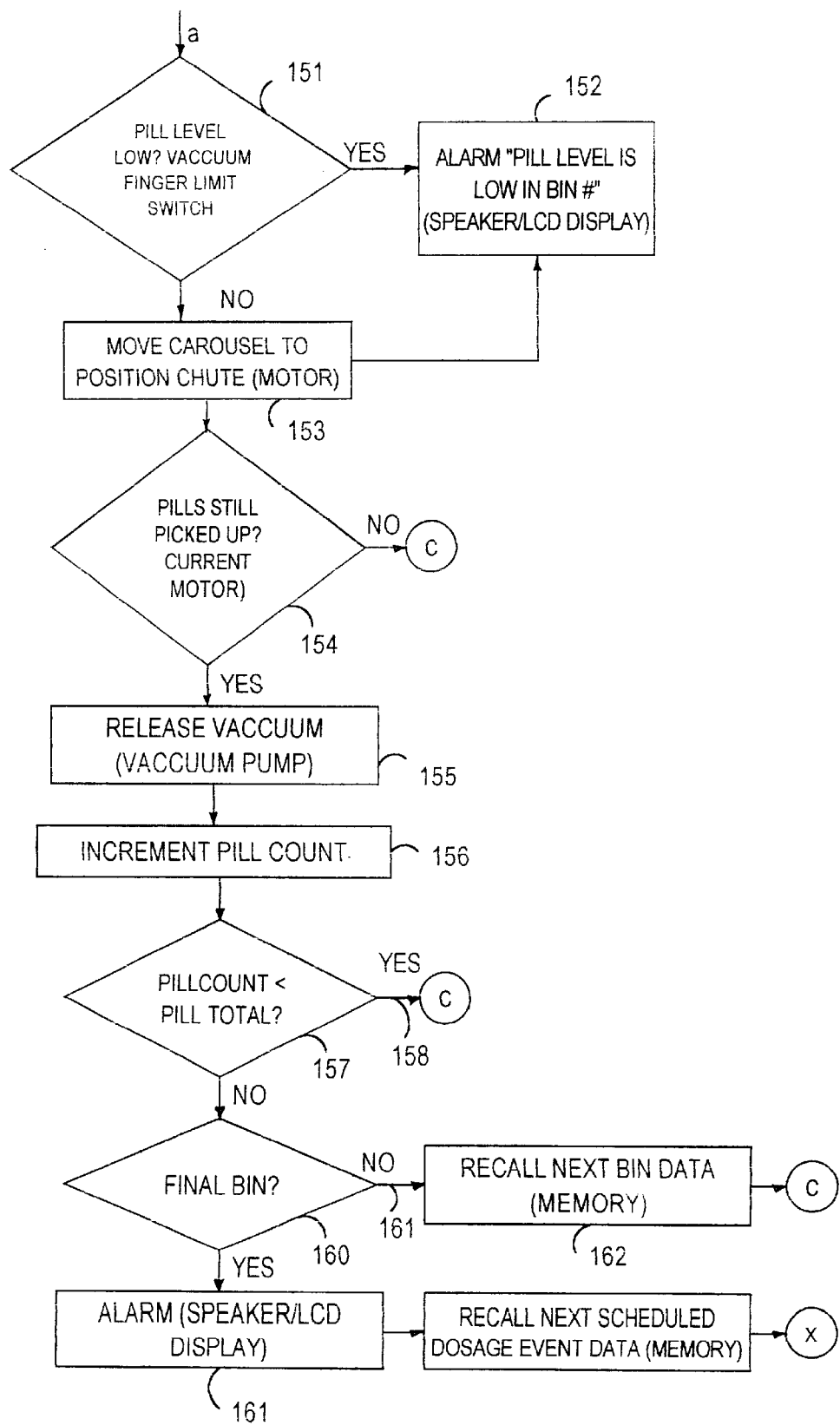
Figure 17A:
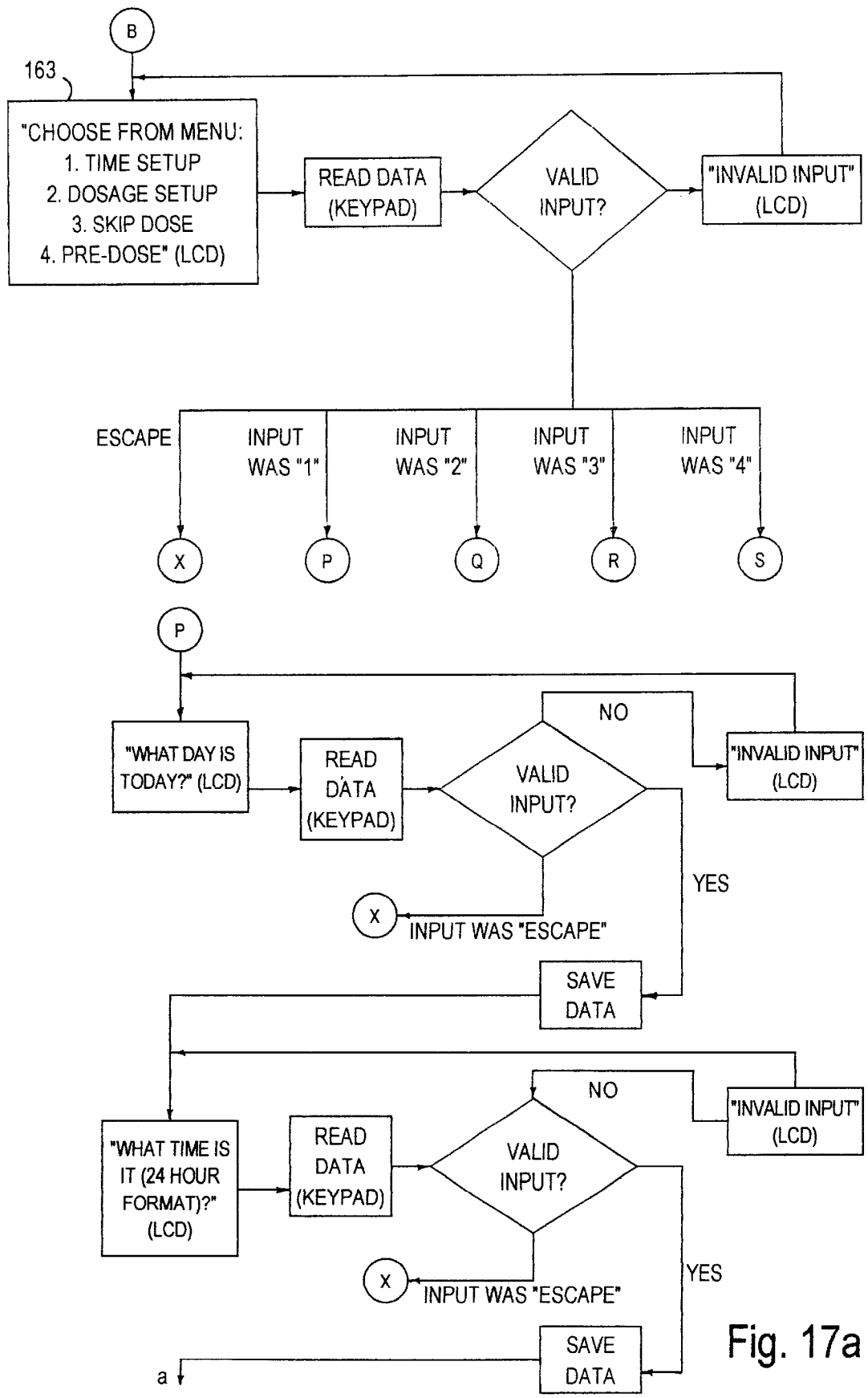
Figure 17B:
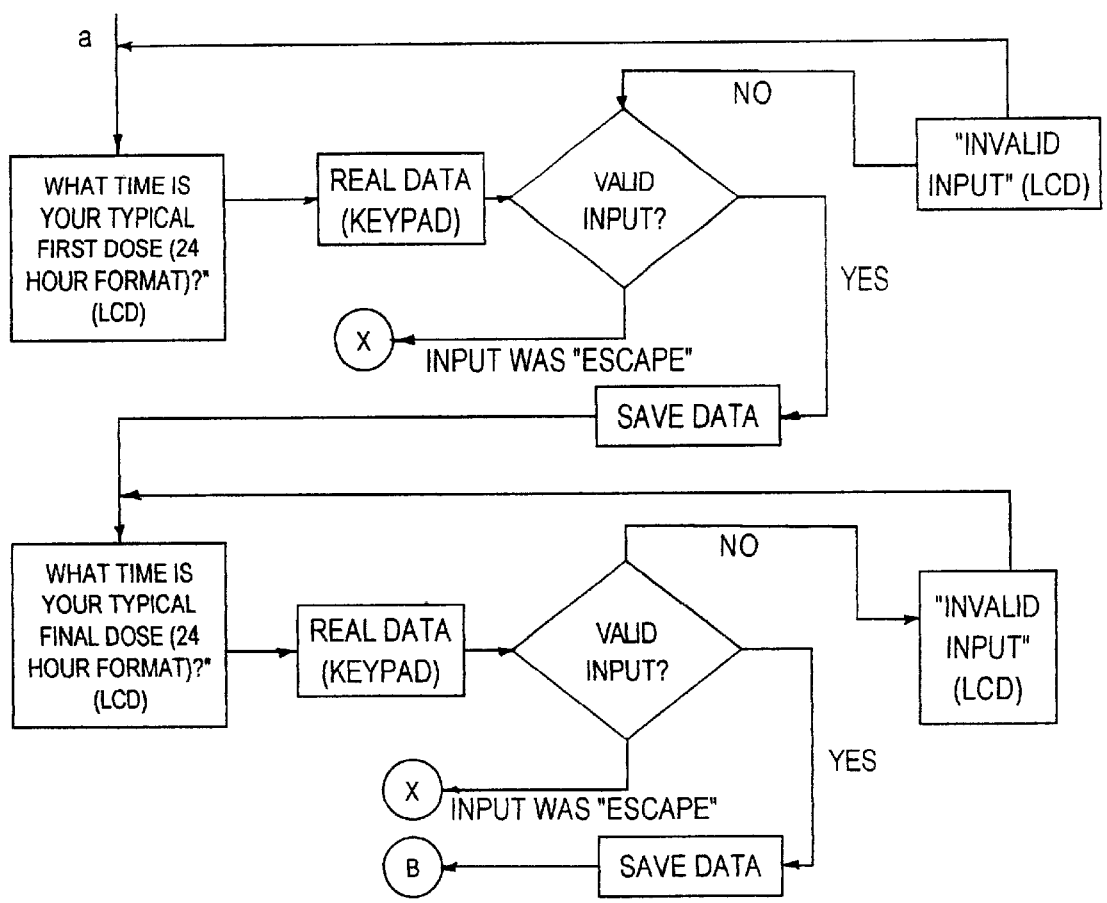
Figure 18A:
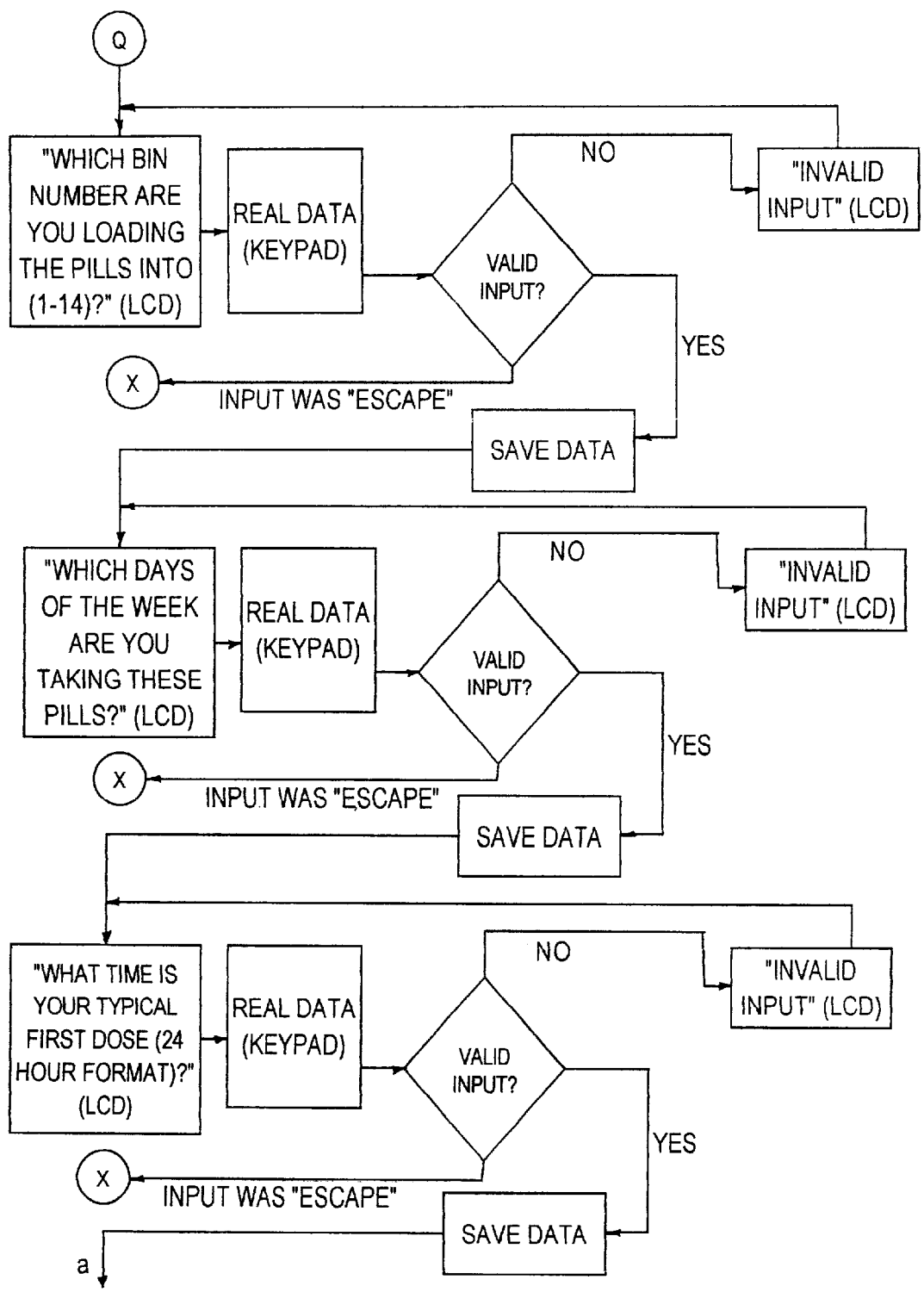
Figure 18B:
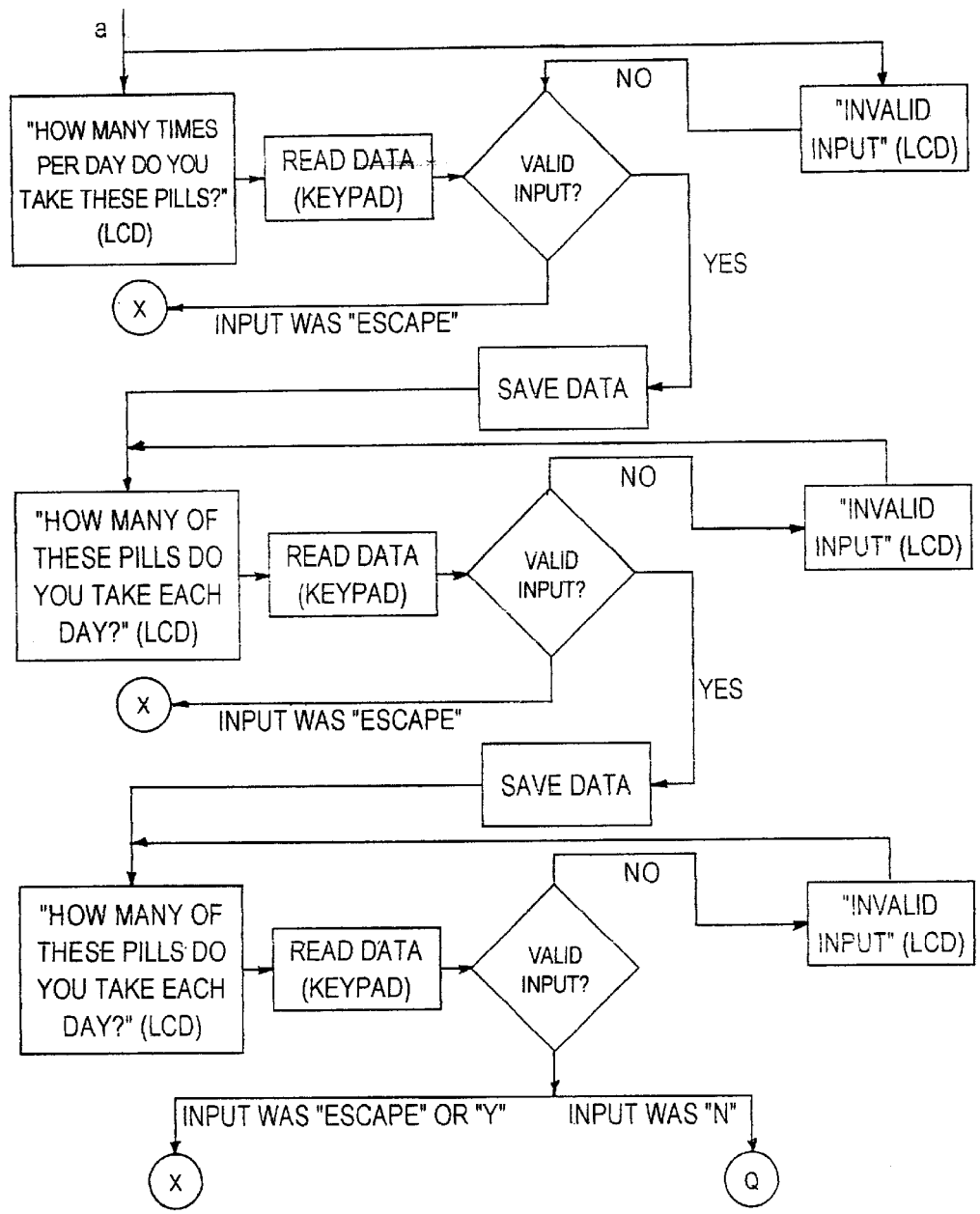

Once all the bins are programmed, the user inserts an appropriate response at 139 and a signal will be sent at "X" to the portion of the flow diagram illustrated in FIGS. 16A and 16B. FIGS. 16A and 16B basically illustrate a functional program. In this diagram, the elimination of the quote symbols, i.e., " " on the text indicates that this text represents internal questions presented to or by the microprocessor.

As illustrated, the microprocessor 120 will automatically continue to sense at 140 if it is time to dispense medicaments 12. If so, the microprocessor will automatically inquire at 141 as to when the last medication dose was taken. If the last dose was not taken and the cup 34 is not removed from the station 36, the system will recycle at 142 to continue to signal "X" which will be refed at 140.

If the cup 34 is removed from station 36 indicating that the last dose was taken, then the microprocessor 120 will signal at 143 the stepper motor 122 to automatically index the carousel to properly position the proper selected bin 50 at the station 36.

As the carousel 40 rotates, the vacuum finger 82 will progressively enter and remove itself from each of the successive bins 50 until the proper selected bin 50 is at the station 36. When the proper bin 50 is at the station 36, the microprocessor 120 will signal at 144 the vacuum pump motor 102 to operate and draw vacuum through the vacuum tube 82. As the vacuum pump motor 102 is operated, initially a relatively high current will be read at 124 until the vacuum probe terminal end 94 of the suction device 82 seals to a medicament 12. Upon such sealing, the current through the meter 124 will be substantially reduced and the system will indicate that at 145 that the pill has been picked up.

If this is not the case and a pill 12 isn't sealed to the probe end 94, a signal will be sent at 146 to the stepper motor 122 causing it to incrementally "bump" or jostle the carousel in an attempt to sufficiently align one of the pills with the end 94 of the pickup device 82 so that the suction forces will draw a random pill into sealing engagement. A counter 147 will allow this pickup device to jostle or bump three times. If after three bumps there is no sealing of the probe end 94 to a random medicament 12, the system will send an alarm signal at 149 to an alarm 148 and to the microprocessor 120 to halt the operation. Assuming, however, that three or less errors are found, the signal will at 150 pass back to the microprocessor 120 causing the carousel 40 to again rotate.

Assuming that the microprocessor 120 receives information that the pill has been picked up, then the microprocessor 120 will verify whether or not the pill level is below a predetermined amount via the limit switch 98. If it is too low, an alarm 152 will sound or a message will be printed at the LCD display 108. Whether or not the bin level is too low, the microprocessor 120 will cause the stepper motor 28 to then rotate the carousel 40 as indicated at 153 which causes the terminal end 94 of the vacuum finger 82 carrying the pill 12 to be cammed upwardly and elevate a raised position above the carousel and forwardly of its lowered position illustrated in FIG. 1 to a position vertically aligned with the discharge chute 60. The microprocessor 120 will sense at 154 whether or not the pill 12 is still picked up and secured to the terminal end 94. If not, a signal will be sent at C to again cause the carousel return to the bin 50 to repeat the operation.

If the pill 12 is identified as still being picked up, however, a signal will be sent at 155 to cut off the pump motor 102 and release the vacuum.

The microprocessor 120 includes a counter 156 which determines and compares the number of pills removed from the first selected bin at 157 to a preselected pill count. If the pill count is not met, a signal is sent at 158 to input C to again move the carousel 40 to reposition the original bin at the discharge station.

If the pill count for the first bin is met, a signal is sent at 160 inquiring as to whether or not this is a final bin and if not, a signal is sent at 161 to recall at 162 the next bin selected 50 and a repeat signal is sent to input C to again move the carousel 40 as indicated at reference character 143 for the second selected bin. This operation will continue until all requisite pills are removed from all bins as required.

If the final bin 50 is indicated to have now had all of the required pills removed, then a signal is sent at 161 to an alarm and/or LCD display 109 and the system will be set to automatically dispense the next dosage regime.

FIGS. 17A, 17B, 18A, 18B, and 19 basically illustrate the system for changing the user program set forth in FIG. 16 and by selecting various inputs at 163, various signals will be sent at X, P, Q, R and S to reprogram the user system. If no modifications are necessary, the escape program is utilized to provide a signal X. This would happen if power was cut off and no modifications in the program was necessary.

Signal X is basically just an escape key to indicate that the system need not be modified.

Figure 19:
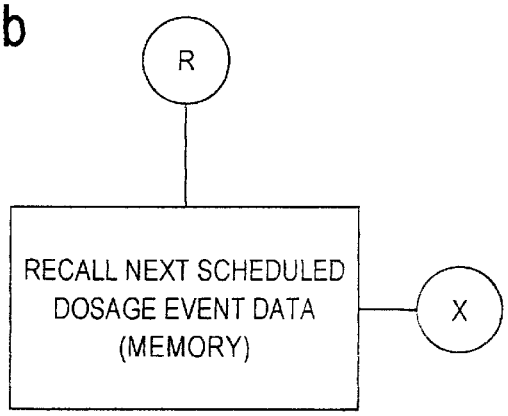

FIG. 19 basically indicates that if the user wants to skip a dose, the signal is set at R and the system will advance to the next scheduled memory.

For pre-dosing, a signal is sent at S to move the carousel, assuming that the last dose was taken at 141, 143 in FIG. 16A.

It is to be understood that the drawings and descriptive matter are in all cases to be interpreted as merely illustrative of the principles of the invention, rather than as limiting the same in any way, since it is contemplated that various changes may be made in various elements to achieve like results without departing from the spirit of the invention or the scope of the appended claims.

What I claim is:

1. Apparatus for storing and dispensing solid medicaments, comprising:
    a frame including a dispensing station having a medicament storage area;
    bulk storage means including a plurality of individual bulk storage compartments for storing a plurality of said solid medicaments in each container different than the plurality of solid medicaments in each of the other bulk storage compartments;
    medicament retrieving means mounted on said frame at said dispensing station for individually retrieving a single solid medicament from any selected one of said storage compartments and dispensing it to said medicament storage area; and
    mount means for mounting said bulk storage means on said frame for movement thereon relative to said medicament retrieving means to present the selected one of said storage compartments at said dispensing station.

2. The apparatus set forth in claim 1 wherein said mount means includes means for moving said storage compartments in a first path of travel past said dispensing station;
    said medicament retrieving means including a vacuum operated probe mounted on said frame for movement in a second path of travel transverse to said first path under the force of gravity to free fall between a raised position above the level of said bulk storage means and a lowered position received by said selected compartment.

3. The apparatus set forth in claim 1 wherein said medicament retrieving means includes
    an elongate probe having one end moveably mounted on said frame and a free terminal end, integral with said one end, for engaging a random solid medicament in said selected compartment.

4. The apparatus set forth in claim 3 wherein said medicament retrieving means comprises means for moving said elongate probe between a medicament picking position disposed in said selected compartment and a removed position without said selected compartment; said elongate probe comprises a vacuum passage there-through for communicating suction forces from said one end to said free terminal end causing the random solid medicament in said selected compartment to be sealingly engaged by the free terminal end to be held by said free terminal end for movement therewith to said removed position.

5. The apparatus set forth in claim 4 wherein said bulk storage compartments open upwardly, said one end is pivotally mounted on said frame for swinging movement about a horizontal axis to move said terminal end in an arcuate path of travel between a lowered medicament picking position within the selected compartment in sealing engagement with the random solid medicament therein and a raised medicament lifting position above the selected compartment; said terminal end in said lowered position being disposed a predetermined horizontal distance from said horizontal axis and in said raised medicament lifting position a greater predetermined horizontal distance from said horizontal axis.

6. The apparatus set forth in claim 1 wherein said bulk storage means comprising a carousel, rotatably mounted on said frame for rotary movement about a vertical axis in a horizontal path of travel; and said plurality of individual storage compartments are circumferentially disposed and open upwardly.

7. The apparatus set forth in claim 6 wherein said medicament retrieving means comprises a vacuum operated probe for applying vacuum forces to the single solid medicament in said selected compartment and detachably holding it to said free terminal end.

8. The apparatus set forth in claim 7 including means swingably mounting said one end of said probe on one said frame about a horizontal axis for vertically swinging said free terminal end, in an arcuate to-and-fro path of travel between a lower medicament picking radially inner position within said selected compartment and a raised, radially outer medicament lifting position radially outwardly of the radially inner position of said terminal end.

9. The apparatus set forth in claim 8 wherein said medicament retrieving means includes means for removing vacuum forces from said probe in said raised position to release a medicament held by said probe; said carousel includes at least one vertical medicament dispensing passage there-through for receiving and passing a medicament removed from the selected compartment and released by said probe for passage to said medicament storage area.

10. The apparatus set forth in claim 9 wherein said vertical passage is horizontally displaced from said selected compartment; and means is provided for indexing said carousel to remove said selected compartment from said station and to present said passage in vertical alignment with said free terminal end of said probe in said raised position.

11. The apparatus set forth in claim 10 wherein said carousel comprises a plurality of said vertically disposed, medicament dispensing passages there-through circumferentially spaced apart and disposed, horizontally adjacent said individual storage compartments for receiving and vertically passing medicaments discharged from said probe in said raised position; and including means for indexing said carousel to align any selected one of said vertical medicament dispensing passages at said dispensing station for receiving and vertically passing medicament discharged by said probe in said raised position to said medicament storage area.

12. The apparatus set forth in claim 6 wherein said medicament retrieving means comprises
   a vacuum operated probe having said one end pivotally mounted on the frame at one side of said carousel diametrically opposite said selected compartment for swinging movement about a horizontal axis and adapted to be coupled to a source of vacuum, and
   an opposite, free terminal end, cantileverly supported by said one end for swinging movement in a to-and-fro arcuate path of travel between a position in sealing engagement with a random medicament in the selected compartment and in airtight sealing engagement with the random medicament in a raised position above said selected compartment.

13. The apparatus set forth in claim 12 wherein said carousel includes a plurality of circumferentially spaced, radially extending vanes dividing said compartments; and including at least one dispensing passage in said carousel in radial alignment with, and radially outwardly of, one of said vanes, said free terminal end in said raised position being disposed in vertical alignment with said passage when said passage is disposed at said dispensing station, and means for releasing the vacuum to said probe for discharge of said random medicament.

14. The apparatus set forth in claim 6 wherein said medicament retrieving means comprises a vacuum operated probe having
   one end, pivotally mounted on the frame at one side of said carousel relative to said vertical axis, for swinging movement about a horizontal axis and adapted to be coupled to and decoupled from a source of vacuum, and
   an opposite, cantileverly supported free terminal end, cantileverly supported on said one end for swinging movement in a swinging path of travel between a position in sealed engagement with a random medicament in said selected compartment on the diametrically opposite side of said carousel diametrically opposite said one side, and a raised position at a level above said selected compartment.

15. The apparatus set forth in claim 1 wherein said medicament retrieving means comprises a one-piece integral length of hollow vacuum tubing having one end pivotally mounted on said frame for swinging movement about a horizontal axis and an opposite, cantileverly supported free terminal end swingable in an arcuate path between a lower radially inner position sealed to a random solid medicament in said selected storage compartment at said dispensing station and a raised radially outer position removed from said selected storage compartment and disposed at a level above said selected compartment.

16. The apparatus set forth in claim 15 wherein said bulk storage means includes at least one medicament dispensing passage there-through adjacent said selected compartment; said mount means including means for selectively removing said selected compartment from said dispensing station and substantially concurrently moving said medicament dispensing passage to said dispensing station in vertical alignment with said free terminal end in said raised radially outer position.

17. The apparatus set forth in claim 1 wherein said bulk storage means includes at least one medicament dispensing opening extending there-through and disposed between said selected compartment and an adjacent compartment adjacent said selected compartment for receiving and vertically passing a medicament being dispensed to said medicament storage area.

18. The apparatus set forth in claim 17 wherein bulk storage means includes a plurality of spaced apart vertical medicament dispensing passages extending there-through interjacent said bulk storage compartments; said mount means including means for selectively indexing said bulk storage means to remove said selected compartment from said dispensing station and dispose any selected one of said passages at said dispensing station aligned with said medicament storage area.

19. The apparatus set forth in claim 18 wherein medicament retrieving means comprises a vacuum probe having a medicament picking terminal end, mounted on said frame for movement between a lower position, in which said terminal end is sealingly engaging a random medicament in said selected compartment, and an elevated position holding the sealingly engaged, random medicament at a raised level above said selected compartment; said mount means including means for indexing said bulk storage means to remove said selected compartment from, and substantially concurrently move any selected one of said medicament dispensing openings to, said dispensing station and dispose any selected one of said openings at said dispensing station in vertical alignment with said terminal end said probe and in alignment with said storage area; and means is provided for releasing the medicament in said raised level from said terminal end to said selected passage.

20. The apparatus set forth in claim 1 wherein said medicament retrieving apparatus comprises a vacuum probe having one end pivotally mounted on said frame and coupled to source of vacuum and an opposite terminal end for sealing to a medicament in said selected compartment; means mounting said probe for to-and-fro swinging movement into and out of each successive compartment disposed at said station; and means for selectively applying vacuum to said one end when said probe is received in said selected compartment causing said terminal end to seal to a random medicament in the selected compartment.

21. The apparatus set forth in claim 1 wherein bulk storage compartments are circumferentially disposed about an axis; said medicament retrieving means includes one end pivotally mounted about a horizontal axis on said frame at one side of said bulk storage means and an opposite free terminal end integral with said one end for swinging movement in a swinging path of travel between a lowered medicament picking position disposed within said selected compartment on the opposite side of said bulk storage means a predetermined distance away from said horizontal axis and a raised position a further predetermined distance away from said axis and at a level above said selected compartment.

22. The apparatus set forth in claim 1 wherein said bulk storage means comprises a rotary carousel rotatable on said frame about a vertical axis;
  said bulk storage compartments being circumferentially spaced about said axis;
  said medicament retrieving means including an elongate pickup finger having
    an end pivotally moveable about a horizontal axis on said frame at one side of said vertical axis and at one side of said rotary carousel diametrically opposite said selected compartment, and
    an opposite free terminal medicament pick up end, integral with said one end;
  and means mounting said elongate pickup finger on said frame for swinging movement in which said free terminal end moves between a lowered medicament picking position disposed within said selected compartment on a diametrically opposite side of said vertical axis and a predetermined radial distance from said vertical axis and a raised position, a further predetermined radial distance from said vertical axis, and at a level above said selected compartment.

23. Apparatus for storing and dispensing solid medicaments comprising:
  a frame having a medicament retrieving and dispensing station thereon;
  a carousel, mounted on said frame for rotation about a vertical axis, and including
    a plurality of circumferentially spaced-apart, upwardly opening compartments for storing the medicaments in bulk;
  means for rotating said carousel about said vertical axis to dispose any selected one of said compartments at said retrieving and dispensing station; and
  medicament retrieving means swingably mounted on said frame between a lowered, pill retrieving position detachably coupled to a solid medicament in the selected compartment and an elevated position above the selected compartment for lifting a solid medicament from said selected compartment to an elevated position above said carousel.

24. The apparatus set forth in claim 23 wherein said medicament retrieving means including means for releasing the medicament in said elevated position for passage to said retrieving and dispensing station; said carousel includes vertical passage means there-through, circumferentially displaced from said storage compartments, for receiving the solid medicament released by said medicament retrieving means in said elevated position.

25. The apparatus set forth in claim 24 including means for selectively disposing said passage means at said retrieving and dispensing station; and wherein said medicament retrieving means includes means for releasing and dispensing a lifted medicament from said medicament retrieving means in said raised position to said passage means at said retrieving and dispensing station.

26. The apparatus set forth in claim 24 wherein said vertical passage means includes a plurality of circumferentially spaced-apart vertical medicament dispensing passages; and further including control means for rotating said carousel to selectively move said selected compartment away from said retrieving and dispensing station and dispose any selected one of said passages at said retrieving and dispensing station in vertical alignment with medicament retrieving means in said elevated position.

27. The apparatus set forth in claim 26 wherein each of said vertical passages is disposed circumferentially between a pair of adjacent ones of said compartments.

28. The apparatus set forth in claim 27 including means for selectively decoupling the flow of vacuum to said hollow vacuum tube from the vacuum source when said selected one of said passages is at said station in vertical alignment with said free terminal open end.

29. The apparatus set forth in claim 26 wherein said medicament retrieving means comprises means for releasing and dispensing a lifted medicament in said elevated position to said selected one of said passages at said retrieving and dispensing station.

30. The apparatus set forth in claim 28 wherein said medicament retrieving means comprises a hollow vacuum tube having one end adapted to be coupled to a vacuum source and a free terminal open extended end for sealing to a solid medicament to be lifted to said elevated position.

31. The apparatus set forth in claim 23 wherein said medicament retrieving comprises a probe having one end pivotally mounted on said frame and an opposite, cantileverly supported free terminal end swingable in a to-and-fro arcuate path between a lowered position sealed to a solid medicament in said selected compartment and said elevated position above said carousel; means for selectively releasing the solid medicament from said medicament retrieving means in said elevated position above said carousel.

32. The apparatus set forth in claim 31 including dispensing passage means in said carousel for receiving and vertically passing the released solid medicament to a storage area on said frame; and control means for indexing said carousel to move said selected compartment from, and move said dispensing passage means to, said station in vertical alignment with a solid medicament in said elevated position.

33. Apparatus for storing and dispensing solid medicaments comprising:
  a frame having a medicament retrieving and dispensing station;
  a bulk storage carousel, rotatably mounted on said frame for rotation about a vertical axis, including
    a plurality of circumferentially spaced, upwardly opening compartments for storing a plurality of solid medicaments in bulk in each compartment different than the plurality of solid medicaments in each other compartment;
    a plurality of circumferentially spaced apart vertical discharge passages through said carousel adjacent said compartments;
  means for rotating said carousel about said axis to dispose any selected one of said compartments and said discharge passages at said station; and
  means on said frame for individually removing a medicament from the selected one of said compartments when said selected one of said compartments is disposed at said station and raising it to an elevated position above said carousel and for releasing the elevated medicament and discharging it to the selected one of the discharge passages when the selected one of the discharge passages is at said station.

34. The apparatus set forth in claim 33 wherein one of said plurality of passages is circumferentially disposed between every other pair of said circumferentially spaced compartments.

35. The apparatus set forth in claim 34 including control means for rotatably indexing said carousel in a to-and-fro circumferential path to alternately repeatedly dispose one of said compartments and one of said passages at said station.

36. The apparatus set forth in claim 34 wherein said means for removing comprises a probe having one end pivotally mounted on said frame and an opposite free terminal medicament grasping end cantileverly supported thereon for movement in a to-and-fro arcuate path of travel between a lowered position grasping a medicament in said selected compartment and a raised position above said compartment.

37. The apparatus set forth in claim 36 including means coupled to said probe for releasing the grasped medicament from said free end in said raised position when said selected discharge passage is at said station.

38. The apparatus set forth in claim 37 wherein said probe comprises a hollow tube having
   one end pivotally mounted on said frame and adapted to be coupled to a source of vacuum and
   an opposite open-ended end for sealing in airtight relation to a solid medicament to be removed from said selected compartment; and
   means for coupling said one end to the source of vacuum when said open-ended end is disposed against a solid medicament in said selected compartment and for decoupling said one end from said source of vacuum when said selected passage is vertically aligned with said one of said vertical discharge passages.

39. The apparatus set forth in claim 33 wherein said means for removing a medicament includes an elongate vacuum finger having
   one end pivotally mounted on said frame at one side of said vertical axis diametrically opposite said selected compartment and
   an opposite free terminal pickup end cantileverly supported by said one end, for swinging movement between a lowered medicament picking position disposed within said selected compartment a predetermined radial distance radially outwardly away from said vertical axis and a raised position a greater predetermined radial distance away from said vertical axis and at a level above the level of said compartments and said passages.

40. Apparatus for storing and dispensing solid medicaments comprising:
   a frame having a medicament retrieving and dispensing station thereon;
   bulk storage means moveably mounted on said frame including a plurality of individual, bulk storage compartments for storing a plurality of solid medicaments in each of the compartments different than the plurality of solid medicaments in each of the other bulk storage compartments;
   means for moving said bulk storage means on said frame to selectively dispose any selected one of said compartment at said dispensing station; and
   medicament retrieving means for retrieving an individual medicament from said selected compartment including
      a single lifting probe having a hollow conduit provided with one end mounted on said frame and adapted to be coupled to a vacuum source and an opposite integral cantileverly supported tip end moveable relative to said selected one of said compartments between a lower medicament grasping position in airtight sealed relation with a single random solid medicament in said selected compartment and a raised position removed from said selected compartment to lift said random solid medicament to a raised level above said selected compartment.

41. The apparatus set forth in claim 40 including means for releasing said selected medicament in said raised level, said bulk storage means includes a dispensing passage therein for receiving and passing the released medicament to a container at said station; and said means for moving said bulk storage means includes means for removing said selected one of said compartments from said station and moving said dispensing passage to said station in vertical alignment with said tip end in said raised position; and means for decoupling said vacuum source from said one end to release the raised solid medicament from said tip end for free fall to said dispensing passage.

42. The apparatus set forth in claim 41 wherein said one end is pivotally mounted on said frame about a horizontal axis which is spaced a predetermined distance from said tip end in said lower medicament lifting position and a greater predetermined distance from said tip end in said raised position.

43. The apparatus set forth in claim 40 wherein including means reacting between said bulk storage means and said lifting probe for vertically moving said single lifting probe between said lower medicament grasping position and said raised position.

44. The apparatus set forth in claim 43 wherein said means reacting comprises cam means, on one of said bulk storage means and said probe, and cam follower means, on the other of said bulk storage means and said probe, for alternately raising said probe to said raised position and allowing said probe to free fall under the force of gravity to said lower position.

45. The apparatus set forth in claim 44 wherein said bulk storage means comprises a rotary carousel having a hub rotatable about a vertical axis, a radially outer annular sidewall, and a plurality of radial vanes spanning said hub and said annular wall to define said bulk storage compartments; said cam means being provided on said annular sidewall.

46. The apparatus set forth in claim 45 wherein said cam means comprises an undulating upper edge of said annular sidewall with alternating peaks and valleys over which said cam follower passes as said carousel is being rotated.

47. The apparatus set forth in claim 46 wherein said peaks are radially aligned with said radial vanes and said troughs are radially aligned with said compartments between said radial vanes.

48. The apparatus set forth in claim 47 including a dispensing passage through said carousel at the junction of at least one of said radial vanes and said annular or sidewall; said means for moving including means for removing said selected compartment from said dispensing station and for moving said passage to said station; and further including means for selectively releasing said selected medicament in said raised level to said dispensing passage at said dispensing station.

49. The apparatus set forth in claim 48 including a plurality of said passages at the junctions of said annular sidewall and alternate ones of said radial vanes.

50. Apparatus for storing and dispensing solid medicaments comprising:
   a frame having a medicament retrieving and dispensing station;
   bulk storage means, moveably mounted on said frame, having a plurality of bulk storage bins for storing a plurality of substantially identical solid medicaments in each of a plurality of separate upwardly opening compartments different than the solid medicaments in all other bins;
   means for moving said bulk storage means on said frame in a path of travel to successively present successive ones of said plurality of storage bins at said dispensing station;

medicament grasping means at said dispensing station for removing a single random medicament from any selected one of said bins and depositing it at said station comprising;

a single vacuum operated probe having one end pivotally mounted on said frame at said station and an opposite integral free end swingable between a raised position removed from said plurality of storage bins when the bulk storage means is being moved and a lower medicament lifting position sealed in airtight relation to the random medicament disposed in any selected one of said bins at said station.

51. The apparatus set forth in claim 50 wherein said means for moving said bulk storage means includes means for moving said bins on said frame in a horizontal path; and said medicament retrieving means includes means for swingably mounting said single vacuum operated probe on said frame for to-and-fro swinging movement in a vertical path of travel between said raised and lowered positions.

52. The apparatus set forth in claim 50 wherein said bulk storage means comprises a carousel, rotatable on said frame about a vertical axis, mounting said plurality of bulk storage bins in circumferentially spaced-apart positions, said means for moving said bulk storage means including means for rotating said carousel about said vertical axis relative to said single vacuum operated probe in said raised position to dispose any selected one of said storage bins at said station.

53. The apparatus set forth in claim 52 including means for swingably mounting said single vacuum probe on said frame at said dispensing station for swinging movement about a horizontal axis relative to said frame and relative to the selected storage bin at said station.

54. The apparatus set forth in claim 53 wherein said single vacuum operated probe includes a hollow tube having one end coupled to a vacuum source and pivotally mounted on said frame and a free terminal end having a hollow tip for communicating negative pressure to the single random solid medicament in said one selected compartment when said probe means is in said lower position engaging said single medicament.

55. The apparatus set forth in claim 52 wherein said single vacuum operated probe comprises an elongate, hollow tube having one end pivotally mounted on said frame for swinging movement about a horizontal axis on one side of said carousel; and an opposite free terminal end cantileverly supported on said one end for swinging movement into a selected compartment on the diametrically opposite side of said carousel, diametrically opposite said one side.

56. The apparatus set forth in claim 52 wherein said bulk storage means comprises a carousel rotatably about a vertical axis; said bulk storage bins including a plurality of circumferentially spaced-apart radial vanes having radially outer ends, and an annular side wall integrally coupled to said outer ends of said vanes.

57. The apparatus set forth in claim 56 wherein said annular side wall includes an upper undulating cam edge, and cam follower means is coupled to said probe means for following on said cam edge to force said probe to vertically swing as said carousel rotates relative to said probe.

58. The apparatus set forth in claim 57 wherein said cam edge includes a plurality of circumferentially alternately spaced, peaks and valleys.

59. The apparatus set forth in claim 58 wherein said peaks are radially aligned with said vanes.

60. The apparatus set forth in claim 59 including a plurality of vertical passages disposed in said carousel in radial alignment with said outer ends of said radial vanes.

61. The apparatus set forth in claim 50 wherein said frame includes means for supporting an upwardly opening storage container at said dispensing station at a level below said selected bin at said dispensing station; and further including a vertical passage in said bulk storage means adjacent said selected bin for receiving and vertically passing a medicament released by said probe means in said raised position to the storage container at said station, said means for moving said bulk storage means including means for moving said selected bin away from said station and concurrently moving said vertical passage to said station.

62. Apparatus for storing and dispensing solid medicaments comprising:

a frame having a retrieving and dispensing station thereon for mounting a storage container;

a rotary carousel, rotatably mounted on said frame about a vertical axis, including a plurality of circumferentially spaced, upwardly opening compartments for storing a plurality of solid medicaments in each compartment different than the medicaments in each other compartment;

means for rotating said carousel to successively dispose said compartments at said station;

a vacuum operated probe including one end adapted to be coupled to a source of vacuum and a free cantileverly supported terminal end adapted to be sealingly engaged to a single solid medicament in any selected one of said compartments;

means mounting said one end of said probe on said frame, for swinging movement in response to rotation of said carousel about said vertical axis to successively dispose said terminal end in a lowered position engaging a solid medicament in each successive compartment disposed at said station and a raised position above said compartments when said compartments are moving to and from said station; and means for selectively coupling a source of vacuum to said one end when said free terminal end is in any selected one of said compartments to cause said free terminal end to randomly sealingly engage one random medicament in said selected compartment to be carried thereby and lifted by said terminal end to said raised position above said selected compartment.

63. The apparatus set forth in claim 62 wherein said carousel includes a dispensing passage there-through circumferentially adjacent the selected compartment; said means for rotating including means for presenting said passage at said station in vertical alignment with said terminal end for receiving the random medicament from said terminal end; and including means for decoupling the vacuum source to said one end of said vacuum operated probe to release the random medicament from said raised position through said passage to a container at said station.

64. Apparatus for storing and individually dispensing solid medicaments comprising:

a frame;

a carousel including a hub rotatably mounted on said frame for rotation about a vertical axis, a plurality of upwardly opening, medicament receiving compartments for storing a plurality of solid medicaments in each compartment including a radially outer, annular wall having an upper edge, and a plurality of circumferentially spaced radial vanes spanning said hub and said annular wall;

a plurality of medicament dispensing passages provided through said carousel in radial alignment with said radial vanes; and a vacuum finger having one end, swingably mounted on said frame and adapted to be coupled to a source of vacuum, and an opposite free terminal end cantileverly supported on said one end;

cooperating cam means and cam follower means on said annular sidewall and said vacuum finger for guiding said vacuum finger to vertically swing and dispose said free end in a lowered position sealed in airtight relation with a random medicament in a selected one of said bins and a raised position holding said random medicament above said selected one of said bins or any selected one of said passages at said dispensing station as said carousel rotates about said vertical axis.

65. The apparatus set forth in claim 64 wherein said cam means comprises an undulating ridge provided in said upper end of said sidewall and said cam follower means comprises a cam follower roller on said vacuum finger in rolling engagement with said undulating ridge.

66. The apparatus set forth in claim 65 wherein said undulating ridge includes circumferentially alternating raised peaks and lowered valleys, said finger moving downwardly under the force of gravity when said cam follower roller is received by said valleys.

67. A method of storing solid medicaments in bulk and individually dispensing medicaments at a retrieving and dispensing station comprising the steps of:

storing a plurality of medicaments in each of a plurality of upwardly opening circumferentially spaced compartments of a carousel which is rotatable about a vertical axis, different than the medicaments in each of the other compartments;

vertically downwardly swinging an elongate vacuum finger from a raised position in which a terminal tip end of the finger is above the carousel to a lowered position with the terminal tip end of the finger being in airtight sealed relation with one of the medicaments in a selected one of the compartments;

applying vacuum forces to the vacuum finger and said tip end when said terminal tip end is in the selected compartment to sealingly engage and hold the one medicament to the tip end;

vertically upwardly swinging the elongate vacuum finger and the one medicament sealed to said tip end to the raised position;

rotating the carousel about the vertical axis to a position in which a discharge passage in the carousel adjacent said selected compartment is vertically aligned with said tip end at said station; and releasing the vacuum to said vacuum finger at said station and discharging the lifted medicament to said discharge passage at said station.

68. The method set forth in claim 67 wherein said step of vertically upwardly swinging said finger includes the step of swinging one end of said finger about a horizontal axis on a frame adjacent one side of said carousel such that said terminal end in said lowered position is a predetermined radial distance away from said horizontal axis and, in said raised position is a greater predetermined radial distance from said horizontal axis.

69. The method set forth in claim 68 wherein said steps of vertically downwardly and upwardly swinging said elongate vacuum finger includes successively swinging said tip end into and out of each compartment disposed at said station in response to rotation of said carousel.

70. The method set forth in claim 69 wherein said step of swinging the tip end into and out of each successive compartment includes the step of engaging a cam follower roller on said vacuum finger with an undulating cam provided on said carousel.

71. The method set forth in claim 67 wherein said step of vertically swinging said vacuum finger includes the step of moving said vacuum finger vertically into and out of each successive compartment in response to rotation of said carousel, said step of applying a vacuum is accomplished by selectively applying vacuum to said vacuum finger only when said tip end is in said selected one of said compartments and not applying vacuum when said tip end is in any other of said compartments.

72. The method set forth in claim 70 wherein said step of vertically downwardly swinging an elongate vacuum finger includes the step of allowing said vacuum finger to free fall under the force of gravity from said raised position to said lowered position as said carousel rotates.

73. A method of storing solid medicaments in bulk and individually dispensing solid medicaments comprising the steps of:

storing solid medicaments in bulk form in each compartment of a plurality of separate, circumferentially spaced medicament storage compartments which are mounted on a rotary carousel rotatable about a vertical axis;

rotating said carousel about said axis to successively present said storage compartments to a dispensing station;

retrieving one of said medicaments from one selected compartment and elevating it to an elevated position above said carousel; and releasing the medicament in said elevated position above said carousel.

74. The method set forth in claim 73 wherein said rotating step further includes the step of moving a discharge passage, extending through said carousel, to said dispensing station to a position underlying said medicament in said elevated position for receiving the released medicament and concurrently removing said storage compartments from said dispensing station.

75. The method set forth in claim 74 wherein said step of moving the terminal end further including the steps of engaging cam means on one of said carousel and said probe and cooperating cam follower means on the other of said carousel and said probe to vertically swing the probe in response to rotation of said carousel.

76. The method set forth in claim 73 including the step of moving the terminal end of a vacuum operated medicament pickup probe from an elevated position above the carousel to a lowered position into and out of each successive compartment at said dispensing station and raising the probe to said elevated position above said carousel as each successive compartment is being moved away from said dispensing station;

coupling said pickup probe to a vacuum probe when said probe is in any selected one of said compartments causing said terminal end to sealingly engage and detachably hold a random medicament in said selected compartment.

77. Apparatus for storing solid medicaments in bulk and individually dispensing medicaments comprising:
- a frame having a retrieving and dispensing station;
- bulk storage apparatus having a plurality of bulk storage bins for storing a plurality of solid medicaments in bulk in each bin different than the solid medicaments in each other bin;
- means for moving said bulk storage means to successively dispose said bins at said station,
- a vacuum operated probe having one end adapted to be coupled to a source of vacuum, and an opposite terminal tip end for retrieving a medicament;
- means mounting said one end of said vacuum probe on said frame for free fall, in response to movement of said bulk storage means, from a raised position in which said terminal tip end is above said carousel and a lowered position in which said terminal tip end is successively received in each of the bins positioned at said station; and
- means reacting between said frame and said bulk storage means for raising said probe to a position above said bulk storage apparatus as said bulk storage apparatus moves said bins toward said station.

* * * * *